(12) United States Patent
Sakata et al.

(10) Patent No.: US 8,884,287 B2
(45) Date of Patent: Nov. 11, 2014

(54) SEMICONDUCTOR DEVICE AND MANUFACTURING METHOD THEREOF

(71) Applicant: Semiconductor Energy Laboratory Co., Ltd., Atsugi (JP)

(72) Inventors: Junichiro Sakata, Atsugi (JP); Takashi Shimazu, Machida (JP); Hiroki Ohara, Sagamihara (JP); Toshinari Sasaki, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/139,892

(22) Filed: Dec. 24, 2013

(65) Prior Publication Data
US 2014/0113687 A1    Apr. 24, 2014

Related U.S. Application Data

(63) Continuation of application No. 12/683,681, filed on Jan. 7, 2010, now Pat. No. 8,629,432.

(30) Foreign Application Priority Data

Jan. 16, 2009    (JP) ................ 2009-008134

(51) Int. Cl.
| H01L 29/786 | (2006.01) |
| H04M 1/02 | (2006.01) |
| H01L 21/02 | (2006.01) |
| C23C 14/08 | (2006.01) |
| H01L 27/12 | (2006.01) |

(52) U.S. Cl.
CPC ....... *H01L 29/78696* (2013.01); *H04M 1/0266* (2013.01); *H01L 27/1225* (2013.01); *H01L 21/02573* (2013.01); *C23C 14/086* (2013.01); *H01L 29/7869* (2013.01); *H01L 21/02631* (2013.01); *H01L 29/78693* (2013.01); *H01L 21/02554* (2013.01); *H01L 21/02565* (2013.01); *H01L 21/02592* (2013.01)

USPC ............... 257/43; 257/E29.296; 257/E21.461

(58) Field of Classification Search
USPC ............................ 257/43, E29.296, E21.461
See application file for complete search history.

(56) References Cited

U.S. PATENT DOCUMENTS

| 3,767,434 A | 10/1973 | Thomas |
| 4,621,277 A | 11/1986 | Ito et al. |

(Continued)

FOREIGN PATENT DOCUMENTS

| CN | 1941299 | 4/2007 |
| CN | 101752428 | 6/2010 |

(Continued)

OTHER PUBLICATIONS

Minami et al., "Highly Conductive and Transparent Silicon Doped Zinc Oxide Thin Films Prepared by RF Magnetron Sputtering," Japanese Journal of Applied Physics, vol. 25, No. 9, pp. L776-L779, Sep. 1986.

(Continued)

*Primary Examiner* — Matthew W Such
*Assistant Examiner* — Monica D Harrison
(74) *Attorney, Agent, or Firm* — Eric J. Robinson; Robinson Intellectual Property Law Office, P.C.

(57) ABSTRACT

A semiconductor device including a thin film transistor which includes an oxide semiconductor layer and has high electric characteristics and reliability. Film deposition is performed using an oxide semiconductor target containing an insulator (an insulating oxide, an insulating nitride, silicon oxynitride, aluminum oxynitride, or the like), typically $SiO_2$, so that the semiconductor device in which the Si-element concentration in the thickness direction of the oxide semiconductor layer has a gradient which increases in accordance with an increase in a distance from a gate electrode is realized.

12 Claims, 21 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,847,410 A | 12/1998 | Nakajima |
| 6,197,625 B1 | 3/2001 | Choi |
| 6,294,274 B1 | 9/2001 | Kawazoe et al. |
| 6,303,503 B1 | 10/2001 | Kamal et al. |
| 6,485,807 B1 | 11/2002 | Park |
| 6,563,174 B2 | 5/2003 | Kawasaki et al. |
| 6,586,346 B1 | 7/2003 | Yamazaki et al. |
| 6,727,522 B1 | 4/2004 | Kawasaki et al. |
| 6,838,308 B2 | 1/2005 | Haga |
| 6,960,812 B2 | 11/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,385,265 B2 | 6/2008 | Manabe et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,598,670 B2 | 10/2009 | Kumaki et al. |
| 7,601,984 B2 | 10/2009 | Sano et al. |
| 7,648,861 B2 | 1/2010 | Yamazaki et al. |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 * | 4/2011 | Akimoto et al. ............... 257/72 |
| 7,977,255 B1 | 7/2011 | Scheer et al. |
| 7,994,500 B2 | 8/2011 | Kim et al. |
| 8,058,645 B2 | 11/2011 | Jeong et al. |
| 8,058,647 B2 | 11/2011 | Kuwabara et al. |
| 8,143,115 B2 | 3/2012 | Omura et al. |
| 8,148,721 B2 | 4/2012 | Hayashi et al. |
| 8,148,779 B2 | 4/2012 | Jeong et al. |
| 8,158,974 B2 | 4/2012 | Yano et al. |
| 8,178,926 B2 | 5/2012 | Nakayama |
| 8,188,480 B2 | 5/2012 | Itai |
| 8,202,365 B2 | 6/2012 | Umeda et al. |
| 8,203,143 B2 | 6/2012 | Imai |
| 8,258,023 B2 | 9/2012 | Lee |
| 8,274,077 B2 | 9/2012 | Akimoto et al. |
| 8,274,078 B2 | 9/2012 | Itagaki et al. |
| 8,344,387 B2 | 1/2013 | Akimoto et al. |
| 8,466,463 B2 | 6/2013 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0062134 A1 | 3/2005 | Ho et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152214 A1 | 7/2007 | Hoffman et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0191204 A1 | 8/2008 | Kim et al. |
| 2008/0203387 A1 | 8/2008 | Kang et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0309096 A1 | 12/2009 | Iwasaki |
| 2010/0025678 A1 | 2/2010 | Yamazaki et al. |
| 2010/0065844 A1 | 3/2010 | Tokunaga |
| 2010/0073268 A1 | 3/2010 | Matsunaga et al. |
| 2010/0090215 A1 | 4/2010 | Lee |
| 2010/0092800 A1 | 4/2010 | Itagaki et al. |
| 2010/0109002 A1 | 5/2010 | Itagaki et al. |
| 2010/0117078 A1 | 5/2010 | Kuwabara et al. |
| 2010/0117999 A1 | 5/2010 | Matsunaga et al. |
| 2010/0133530 A1 | 6/2010 | Akimoto et al. |
| 2010/0136743 A1 | 6/2010 | Akimoto et al. |
| 2010/0148170 A1 | 6/2010 | Ueda et al. |
| 2010/0155716 A1 | 6/2010 | Cheong et al. |
| 2010/0187523 A1 | 7/2010 | Sakata et al. |
| 2010/0219410 A1 | 9/2010 | Godo et al. |

(56) References Cited

U.S. PATENT DOCUMENTS

| | | | |
|---|---|---|---|
| 2011/0049508 A1 | 3/2011 | Kawamura et al. | |
| 2011/0104851 A1 | 5/2011 | Akimoto et al. | |
| 2011/0117697 A1 | 5/2011 | Akimoto et al. | |
| 2011/0121290 A1 | 5/2011 | Akimoto et al. | |
| 2011/0193083 A1 | 8/2011 | Kim et al. | |
| 2012/0168748 A1 | 7/2012 | Yano et al. | |
| 2012/0168750 A1 | 7/2012 | Hayashi et al. | |
| 2012/0319103 A1 | 12/2012 | Lee | |

FOREIGN PATENT DOCUMENTS

| | | |
|---|---|---|
| EP | 1 737 044 A | 12/2006 |
| EP | 1 770 788 A | 4/2007 |
| EP | 1 995 787 A | 11/2008 |
| EP | 1 998 373 A | 12/2008 |
| EP | 1 998 374 A | 12/2008 |
| EP | 1 998 375 A | 12/2008 |
| EP | 2 197 034 A | 6/2010 |
| EP | 2 226 847 A | 9/2010 |
| EP | 2 423 966 A | 2/2012 |
| JP | 60-198861 | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 | 10/1991 |
| JP | 05-251705 A | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2005-093974 | 4/2005 |
| JP | 2006-165529 | 6/2006 |
| JP | 2007-073703 | 3/2007 |
| JP | 2007-096055 | 4/2007 |
| JP | 2007-123861 | 5/2007 |
| JP | 2007-250983 | 9/2007 |
| JP | 2008-235871 | 10/2008 |
| JP | 2008-276212 A | 11/2008 |
| JP | 2010-161339 A | 7/2010 |
| JP | 2010-525602 | 7/2010 |
| WO | WO 2004/114391 | 12/2004 |
| WO | WO 2007/119386 | 10/2007 |
| WO | WO 2008/069056 | 6/2008 |
| WO | WO 2008/069255 | 6/2008 |
| WO | WO 2008/105347 | 9/2008 |
| WO | WO-2008/117739 | 10/2008 |
| WO | WO-2008/126884 | 10/2008 |
| WO | WO 2008/133456 | 11/2008 |

OTHER PUBLICATIONS

Prins et al., "A Ferroelectric Transparent Thin-Film Transistor," Appl. Phys. Lett. (Applied Physics Letters), vol. 68, No. 25, pp. 3650-3652, Jun. 17, 1996.

Nakamura et al., "The Phase Relations in the $In_2O_3$—$Ga_2ZnO_4$—Zno System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, pp. 1269-1272.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nakamura, et al., Syntheses and Crystal Structures of New Homologous Compounds, Indium Iron Zinc Oxides ($InFeO_3(ZnO)_m$ (m: natural number) and Related Compounds, Kotai Butsuri (Solid State Physics), vol. 28, No. 5, pp. 317-327, 1993.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Takahashi et al., "Theoretical Analysis of IGZO Transparent Amorphous Oxide Semiconductor," IDW '08: Proceedings of the $15^{th}$ International Display Workshops, Dec. 3, 2008, pp. 1637-1640.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Li et al., "Modulated Structures of Homologous Compounds In $MO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Avanced Materials), 2006, vol. 18, No. 3, pp. 339-342.

Tsuda et al., "Ultra Low Power Consumption Technologies for Mobile TFT-LCDs," IDW '02: Proceedings of the $9^{th}$ International Display Workshops, Dec. 4, 2002, pp. 295-298.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide—Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the $16^{th}$ International Display Workshops, 2009, pp. 689-692.

(56) References Cited

OTHER PUBLICATIONS

Park et al., "Amorphous Indium-Gallium-Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by Peald Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 IN. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13th International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Fortunato et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Son et al., "42.4L: Late-News Paper: 4 Inch QVGA AMOLED Driven by the Threshold Voltage Controlled Amorphous GIZO $(Ga_2O_3$—$In_2O_3$—ZnO) TFT," SID Digest '08: SID International Symposium Digest of Technical Papers, May 20, 2008, vol. 39, pp. 633-636.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Nakamura, "Synthesis of Homologous Compound with New Long-Period Structure," NIRIM Newsletter, Mar. 1, 1995, vol. 150, pp. 1-4.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size Amoled Displays," IDW '08: Proceedings of the 6th International Display Workshops, Dec. 3, 2008, pp. 581-584.

Kim et al., "High-Performance oxide thin film transistors passivated by various gas plasmas," 214th ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

(56) References Cited

OTHER PUBLICATIONS

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

Chiang et al., "High Mobility Transparent Thin-Film Transistors With Amorphous Zinc Tin Oxide Channel Layer," Appl. Phys. Lett. (Applied Physics Letters), 2005, vol. 86, No. 1, pp. 013503-1-013503-3.

Miyasako et al., "Ferroelectric-Gate Thin-Film Transistors Using Indium—Tin—Oxide Channel With Large Charge Controllability," Appl. Phys. Lett. (Applied Physics Letters), 2005, vol. 86, No. 16, pp. 162902-1-162902-3.

Nishii et al., "High-Mobility Field-Effect Transistors Based on Single-Crystalline ZnO Channels," Jpn. J. Appl. Phys. (Japanese Journal of Applied Physics), Sep. 9, 2005, vol. 44, No. 38, pp. L1193-L1195.

Minami et al., "Highly Transparent and Conductive Zinc-Stannate Thin Films Prepared by RF Magnetron Sputtering," Jpn. J. Appl. Phys. (Japanese Journal of Applied Physics), Dec. 1, 1994, vol. 33, No. 12A, Part 2, pp. L1693-L1696.

Chinese Office Action (Application No. 201010002886.5) dated Jul. 29, 2013.

* cited by examiner

SEMICONDUCTOR DEVICE AND MANUFACTURING METHOD THEREOF

BACKGROUND OF THE INVENTION

This application is a continuation of Application No. 12/683681, filed on Jan. 7, 2010, now Pat. No. 8,629,432.

1. Field of the Invention

The present invention relates to a semiconductor device including a circuit which includes a thin film transistor (hereinafter, referred to as TFT) and a manufacturing method thereof. For example, the present invention relates to an electronic appliance mounted with an electro-optic device typified by a liquid crystal display panel or a light-emitting display device including an organic light-emitting element as a component.

In this specification, a semiconductor device refers to all types of devices which can function by using semiconductor characteristics. An electro-optical device, a semiconductor circuit, and an electronic device are all included in the category of the semiconductor device.

2. Description of the Related Art

There are a variety of kinds of metal oxides intended for many uses. Indium oxide is a well-known material and is used as a transparent electrode material necessary for a liquid crystal display or the like.

Some metal oxides have semiconductor characteristics. The metal oxides having semiconductor characteristics are one kind of compound semiconductor. The compound semiconductor is a semiconductor formed by two or more kinds of atoms bonded together. In general, metal oxides are insulators; however, it is known that metal oxides are semiconductors depending on the combination of elements included in the metal oxides.

For example, among metal oxides, tungsten oxide, tin oxide, indium oxide, zinc oxide, and the like are known as the metal oxides having semiconductor characteristics. The metal oxide as above has been used for a transparent semiconductor layer serving as a channel formation region in a thin film transistor (as disclosed in Patent Documents 1 to 4 and Non-Patent Document 1).

Examples of metal oxides include not only an oxide of a single metal element but also an oxide of a plurality of metal elements. For example, $InGaO_3(ZnO)_m$ (m is a natural number) which is a homologous compound is a known material (Non-Patent Documents 2 to 4).

It has been confirmed that such an In—Ga—Zn based oxide as above is applicable to a channel layer of a thin film transistor (Patent Document 5 and Non-Patent Documents 5 and 6).

Further, attention has been drawn to a technique for manufacturing a thin film transistor using an oxide semiconductor and applying to an electronic device or an optical device. For example, Patent Document 6 and Patent Document 7 disclose a technique by which a thin film transistor is manufactured using zinc oxide or an In—Ga—Zn—O based oxide semiconductor as an oxide semiconductor film and such a transistor is used as a switching element or the like of an image display device.

REFERENCE

Patent Documents

[Patent Document 1] Japanese Published Patent Application No. S60-198861

[Patent Document 2] Japanese Published Patent Application No. H8-264794

[Patent Document 3] Japanese Translation of PCT International Application No. H11-505377

[Patent Document 4] Japanese Published Patent Application No. 2000-150900

[Patent Document 5] Japanese Published Patent Application No. 2004-103957

[Patent Document 6] Japanese Published Patent Application No. 2007-123861

[Patent Document 7] Japanese Published Patent Application No. 2007-096055

Non-Patent Document

[Non-Patent Document 1] M. W. Prins, K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68 p. 3650-3652

[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, p. 298-315

[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *J. Solid State Chem.*, 1995, Vol. 116, p. 170-178

[Non-Patent Document 4] M. Nakamura, N. Kimizuka, T. Mohri, and M. Isobe, "Homologous Series, Synthesis and Crystal Structure of $InFeO_3(ZnO)m$ (m: natural number) and its Isostructural Compound", *KOTAI BUTSURI (SOLID STATE PHYSICS)*, 1993, Vol. 28, No. 5, p. 317-327

[Non-Patent Document 5] K. Nomura, H. Ohta, K. Ueda, T. Kamiya, M. Hirano, and H. Hosono, "Thin-film transistor fabricated in single-crystalline transparent oxide semiconductor", *SCIENCE*, 2003, Vol. 300, p. 1269-1272

[Non-Patent Document 6] K. Nomura, H. Ohta, A. Takagi, T. Kamiya, M. Hirano, and H. Hosono, "Room-temperature fabrication of transparent flexible thin-film transistors using amorphous oxide semiconductors", *NATURE*, 2004, Vol. 432 p. 488-492

An object of an embodiment of the present invention is to provide a semiconductor device including a thin film transistor which includes an oxide semiconductor layer and has high electric characteristics and reliability.

SUMMARY OF THE INVENTION

As an oxide semiconductor layer, a material containing at least zinc is used. Further, a zinc oxide is easy to be crystallized, and therefore, in order to realize an amorphous oxide semiconductor layer, film deposition is performed by using an oxide semiconductor target containing an insulator (e.g., an insulating oxide such as silicon oxide, germanium oxide, or aluminum oxide, an insulating nitride such as silicon nitride or aluminum nitride, or silicon oxynitride, aluminum oxynitride, or the like), typically $SiO_2$ at from 0.1 wt % to 10 wt % inclusive, preferably at form 1 wt % to 6 wt % inclusive. $SiO_x$ (x>0) which hinders crystallization is contained in the oxide semiconductor layer, which enables improvement of the heat resistance, reduction of characteristic variation, or prevention of characteristic fluctuation with long-term use of a thin film transistor to be achieved.

Further, $SiO_x$, which hinders crystallization, contained in the oxide semiconductor layer can suppress crystallization of the oxide semiconductor layer in the case where thermal treatment is performed after the deposition of the oxide semiconductor layer in the manufacturing process. Further, by employing an amorphous oxide semiconductor layer having a concentration gradient of $SiO_x$, reduction of off current of a thin film transistor is achieved.

One embodiment of the present invention disclosed in this specification is a semiconductor device which includes a gate electrode over an insulating surface, an oxide semiconductor layer containing at least zinc and $SiO_x$, and an insulating layer between the gate electrode and the oxide semiconductor layer, wherein the Si-element concentration in the film thickness direction of the oxide semiconductor layer has a gradient increasing step-by-step in accordance with an increase in the distance from the gate electrode.

The structure of the thin film transistor may be a bottom-gate structure in which an oxide semiconductor layer is disposed above a gate electrode provided over a substrate having an insulating surface and may be a bottom-contact type.

In the case where the oxide semiconductor layer is provided above the gate electrode, as for the concentration gradient of $SiO_x$ in the oxide semiconductor layer 103 containing $SiO_x$, a higher concentration region is located on the side which is distant from the gate electrode and a lower concentration region is located on the side which is close to the gate electrode. The concentration gradient of $SiO_x$ in the oxide semiconductor layer 103 containing $SiO_x$ changes step-by-step or continuously.

The concentration gradient which changes step-by-step means that the Si-element concentration increases or decreases step-by-step in the film thickness direction. For example, when a graph in which the horizontal axis indicates the film thickness and the vertical axis indicates the Si-element concentration is formed, a line which connects a plurality of plotted points describes an upward-sloping or downward-sloping step-by-step line.

The concentration gradient which changes continuously means that the Si-element concentration changes gently in the film thickness direction. For example, when a graph in which the horizontal axis indicates the film thickness and the vertical axis indicates the Si-element concentration is formed, a line which connects a plurality of plotted points describes an upward-sloping or downward-sloping curve or straight line.

The oxide semiconductor layer is a single layer or a stacked layer of two or more layers. For example, a first oxide semiconductor layer having a fixed Si-element concentration and a second oxide semiconductor layer in which the Si-element concentration has a gradient changing continuously may be stacked. Alternatively, a first oxide semiconductor layer which does not contain a Si element and a second oxide semiconductor layer having a fixed Si-element concentration may be stacked; it can be regarded that this stacked layer shows a concentration gradient which changes step-by-step.

As one example of the oxide semiconductor layer, an In—Ga—Zn—O based oxide semiconductor can be given. The same or similar function as/to the above can be obtained by adding $SiO_x$ to any of the following: an In—Sn—Zn—O based oxide semiconductor, an In—Al—Zn—O based oxide semiconductor, a Sn—Ga—Zn—O based oxide semiconductor, an Al—Ga—Zn—O based oxide semiconductor, a Sn—Al—Zn—O based oxide semiconductor, an In—Zn—O based oxide semiconductor, a Sn—Zn—O based oxide semiconductor, an Al—Zn—O based oxide semiconductor, and a Zn—O based oxide semiconductor.

An embodiment of the present invention for the purpose of realizing the above structure is a method for manufacturing a semiconductor device including the steps of forming a gate electrode over an insulating surface, forming an insulating layer over the gate electrode, and forming an oxide semiconductor layer over the insulating layer, in which the Si-element concentration in the film thickness direction increases in accordance with an increase in the distance from the gate electrode, by a sputtering method with use of a first oxide semiconductor target and then by a sputtering method with use of a second oxide semiconductor target containing $SiO_2$ at from 0.1 wt % to 10 wt % inclusive.

The structure of the thin film transistor of the present invention may be a top-gate structure in which an oxide semiconductor layer is disposed below a gate electrode provided over a substrate having an insulating surface. An embodiment of the present invention is a method for manufacturing a semiconductor device including the steps of forming an oxide semiconductor layer over an insulating surface, in which the Si-element concentration in the film thickness direction has a concentration gradient, by a sputtering method with use of a first oxide semiconductor target containing $SiO_2$ at from 0.1 wt % to 10 wt % inclusive and then by a sputtering method with use of a second oxide semiconductor target, forming an insulating layer covering the oxide semiconductor layer, and forming a gate electrode over the insulating layer.

According to the present invention, a semiconductor device including a thin film transistor which includes an oxide semiconductor layer containing $SiO_x$ and has high electric characteristics and reliability.

DETAILED DESCRIPTION OF THE INVENTION

Embodiments of the present invention will be hereinafter described in detail with reference to accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

[Embodiment 1]

In Embodiment 1, an example of a thin film transistor including an oxide semiconductor layer containing $SiO_x$ will be described with reference to FIGS. 1A and 1B.

Figure 1A:
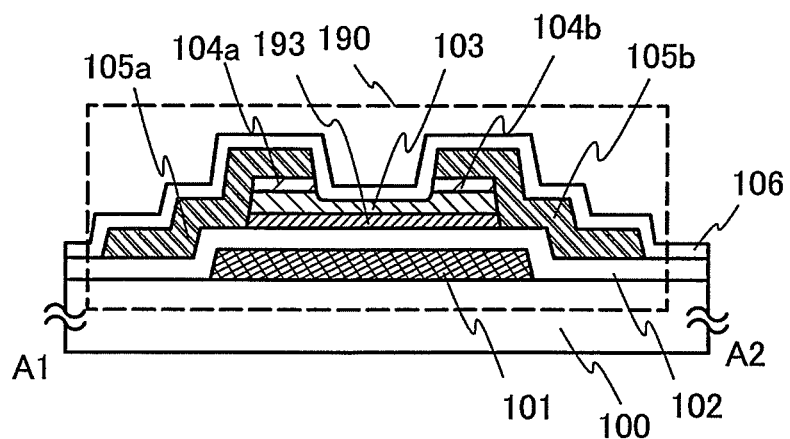
FIGS. 1A to 1C are cross-sectional views and a top view each illustrating an embodiment of the present invention.
Figure 1B:
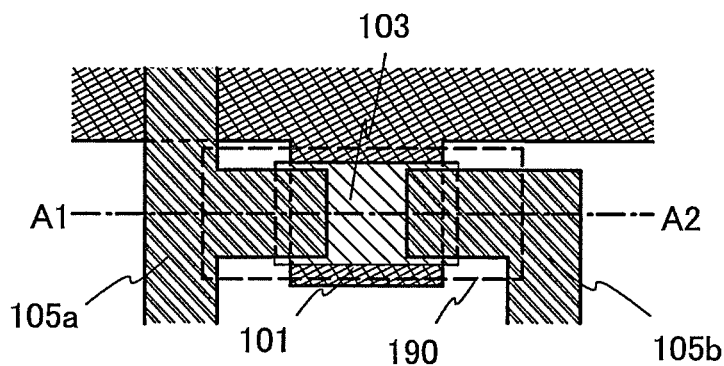

FIG. 1A illustrates a thin film transistor 190 which is one type of bottom-gate structure, and is a cross-sectional view of a structure called a channel-etch type. FIG. 1B illustrates an example of a top view of the thin film transistor whose cross section taken along line A1-A2 corresponds to FIG. 1A.

The thin film transistor 190 illustrated in FIG. 1A includes a gate electrode layer 101 over a substrate 100, a gate insulating layer 102 over the gate electrode layer 101, a stacked layer of oxide semiconductor layers over the gate insulating layer 102, and a source and drain electrode layers 105a and 105b over the stacked layer of the oxide semiconductor layers. In addition, a protective insulating layer 106 is provided, which covers the stacked layer of the oxide semiconductor layers and the source and drain electrode layers 105a and 105b.

The gate electrode layer 101 can be formed using a single layer or a stacked layer using any of the following: a metal material such as aluminum, copper, molybdenum, titanium, chromium, tantalum, tungsten, neodymium, or scandium; an alloy material which contains any of these materials as a main component; and a nitride containing any of these materials. It is preferable to use a low-resistance conductive material such as aluminum or copper. However, such a low-resistance conductive material has the disadvantages of low heat resistance, being easily corroded, and the like; thus, it is preferably used in combination with a conductive material having heat resistance. As the conductive material having heat resistance, molybdenum, titanium, chromium, tantalum, tungsten, neodymium, scandium, or the like is used.

For example, the stacked-layer structure of the gate electrode layer 101 is preferably a two-layer structure where a molybdenum layer is stacked over an aluminum layer, a two-layer structure where a molybdenum layer is stacked over a copper layer, a two-layer structure where a titanium nitride layer or a tantalum nitride layer is stacked over a copper layer, or a two-layer structure where a titanium nitride layer and a molybdenum layer are stacked. Alternatively, a three-layer structure where a tungsten layer or a tungsten nitride layer, an aluminum-silicon alloy layer or an aluminum-titanium alloy layer, and a titanium nitride layer or a titanium layer are stacked is preferable as well.

The gate insulating layer 102 is formed by a plasma CVD method or a sputtering method. The gate insulating layer 102 can be formed using a single layer or a stacked layer of any of a silicon oxide layer, a silicon nitride layer, a silicon oxynitride layer, and a silicon nitride oxide layer by a CVD method, a sputtering method, or the like. Alternatively, the gate insulating layer 102 can be formed using a silicon oxide layer by a CVD method using an organosilane gas.

Of the stacked layer of the oxide semiconductor layers, at least one layer of these is an oxide semiconductor layer containing $SiO_x$; in this embodiment, a first oxide semiconductor layer 193, an oxide semiconductor layer 103 containing $SiO_x$ (also referred to as a second oxide semiconductor layer), and a third oxide semiconductor layer are stacked in this order. Note that the third oxide semiconductor layer is a semiconductor layer having higher electric conductivity than the oxide semiconductor layer 103 containing $SiO_x$ and functions as a buffer layer, an $n^+$ layer, and/or a source and drain regions. In FIG. 1A, the third oxide semiconductor layer is illustrated as a first buffer layer 104a and a second buffer layer 104b.

As each oxide semiconductor layer, any of the following can be applied: an In—Ga—Zn—O based non-single-crystal film, an In—Sn—Zn—O based oxide semiconductor, an In—Al—Zn—O based oxide semiconductor, a Sn—Ga—Zn—O based oxide semiconductor, an Al—Ga—Zn—O based oxide semiconductor, a Sn—Al—Zn—O based oxide semiconductor, an In—Zn—O based oxide semiconductor, a Sn—Zn—O based oxide semiconductor, an Al—Zn—O based oxide semiconductor, an In—O based oxide semiconductor, a Sn—O based oxide semiconductor, and a Zn—O based oxide semiconductor.

In this embodiment, as the first oxide semiconductor layer 193, an In—Ga—Zn—O based non-single-crystal film obtained by a sputtering method using an oxide semiconductor target containing In (indium), Ga (gallium), and Zn (zinc) ($In_2O_3:Ga_2O_3:ZnO=1:1:1$) is used.

Further, as the oxide semiconductor layer 103 containing $SiO_x$, a Zn—O based non-single-crystal film obtained by a sputtering method using an oxide semiconductor target containing $SiO_2$ at 2 wt % is used.

In FIG. 1A, the boundary between the first oxide semiconductor layer 193 and the oxide semiconductor layer 103 containing $SiO_x$ is illustrated schematically. The boundary between oxide semiconductor layers may become indistinct depending on the materials thereof. By employing an oxide semiconductor layer containing $SiO_x$, at least as one layer of the oxide semiconductor layers, electrical characteristics are made to be different between at least the oxide semiconductor layer on the gate insulating layer side, that is, the lower layer portion of the oxide semiconductor layers and the upper layer portion of the oxide semiconductor layers. Further, the Si-element concentration in the film thickness direction of the oxide semiconductor layers has a gradient increasing step-by-step in accordance with an increase in the distance from the gate electrode layer.

The third oxide semiconductor layer which is the first buffer layer 104a and the second buffer layer 104b can be obtained by changing the film deposition condition of the In—Ga—Zn—O based non-single-crystal semiconductor film used as the first oxide semiconductor layer. For example, the flow rate ratio of an oxygen gas in the film-deposition condition of an In—Ga—Zn—O based non-single-crystal film used as the third oxide semiconductor layer is set to be lower than that in the film-deposition condition of the In—Ga—Zn—O based non-single-crystal film used as the first oxide semiconductor layer. As the third oxide semiconductor layer, an In—Ga—Zn—O based non-single-crystal film containing nitrogen, that is, an In—Ga—Zn—O—N based non-single-crystal film (also referred to as an IGZON film) may be used. This In—Ga—Zn—O—N based non-single-crystal film can be obtained as follows: an oxynitride film containing indium, gallium, and zinc is formed by using a target containing an oxide containing indium, gallium, and zinc in an atmosphere containing a nitrogen gas; and the oxynitride film is subjected to thermal treatment. Alternatively, as the third oxide semiconductor layer, a Ga—Zn—O based non-single-crystal film containing nitrogen, that is, a Ga—Zn—O—N based non-single-crystal film (also referred to as an GZON film) may be used.

Further, an impurity element which imparts n-type conductivity may be contained in the third oxide semiconductor layer. As the impurity element, the following can be used: magnesium, aluminum, titanium, iron, tin, calcium, germanium, scandium, yttrium, zirconium, hafnium, boron, thallium, lead, or the like. Magnesium, aluminum, titanium, or the like contained in the buffer layer produces a blocking effect against oxygen or the like, so that the oxygen concentration of the oxide semiconductor layer can be kept within an optimal range by thermal treatment or the like after film deposition.

The source and drain electrode layers 105a and 105b are formed using any of an element selected from Al, Cr, Ta, Ti, Mo, and W, an alloy containing any of these elements, an alloy film containing a combination of any of these elements, and the like.

The protective insulating layer 106 can have a single layer structure or a stacked-layer structure using any of a silicon nitride film, a silicon oxide film, a silicon oxynitride film, an aluminum oxide film, an aluminum nitride film, an aluminum oxynitride film, a tantalum oxide film, and the like by a sputtering method or the like.

By employing the stacked-layer structure of the first oxide semiconductor layer 193 and the oxide semiconductor layer 103 containing $SiO_x$, as an active layer of the thin film transistor 190 as shown in FIG. 1A, a main flow of drain current can be led to the first oxide semiconductor layer 193 when the thin film transistor 190 is in the ON state, so that the field-effect mobility can be increased. In addition, when the thin film transistor 190 is in the OFF state, drain current mainly flows through a portion of the oxide semiconductor layer 103 containing $SiO_x$, which is subjected to etching treatment, so that off-current does not flow through the first oxide semiconductor layer 193 which has higher electric conductivity than the oxide semiconductor layer 103 containing $SiO_x$, thereby decreasing off-current.

Respective materials of the first oxide semiconductor layer 193 and the oxide semiconductor layer 103 containing $SiO_x$ are not particularly limited: for example, the first oxide semiconductor layer 193 may be formed by a sputtering method using an oxide semiconductor target containing $SiO_2$ at 2 wt % and the oxide semiconductor layer 103 containing $SiO_x$ may be formed by a sputtering method using an oxide semiconductor target containing $SiO_2$ at 5 wt %. In that case also, the Si-element concentration in the film thickness direction has a gradient increasing step-by-step in accordance with an increase in the distance from the gate electrode layer.

Figure 1C:
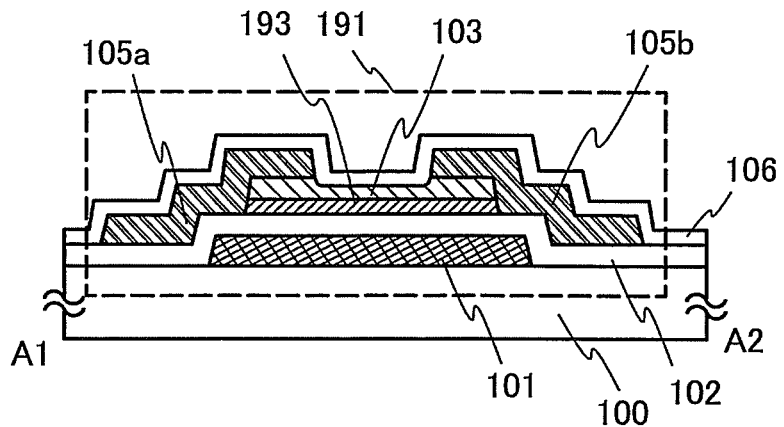

Further, the present invention is not limited to the above-described structure including the first buffer layer 104a and the second buffer layer 104b; a structure in which a buffer layer is not provided may be employed. An example of a cross-sectional view of a thin film transistor 191 in that case is illustrated in FIG. 1C. Note that in FIG. 1C, the structure is the same as FIG. 1A, except in that a buffer layer is not provided, and therefore, the same reference numerals denote the same portions as the corresponding portions in FIG. 1A.

[Embodiment 2]

In Embodiment 2, an example of a thin film transistor including an oxide semiconductor layer containing an insulator such as an insulating oxide typified by silicon oxide, germanium oxide, or aluminum oxide, an insulating nitride typified by silicon nitride or aluminum nitride, or an insulating oxynitride typified by silicon oxynitride or aluminum oxynitride in minutes amount will be described with reference to FIGS. 2A and 2B.

Figure 2A:
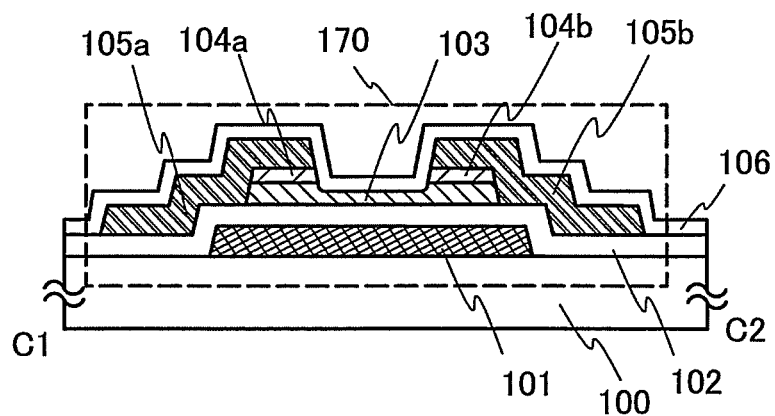
FIGS. 2A to 2C are cross-sectional views and a top view each illustrating an embodiment of the present invention.
Figure 2B:
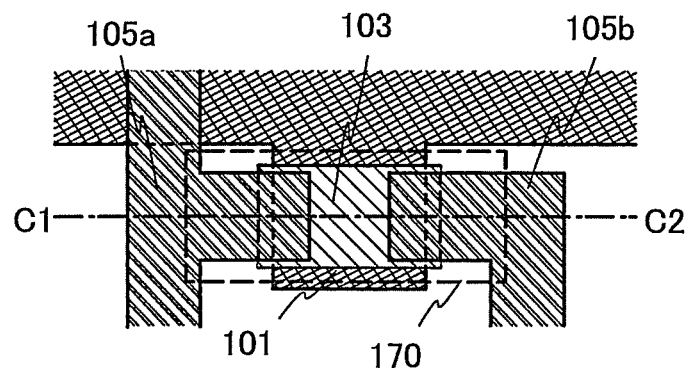

FIG. 2A illustrates a thin film transistor 170 which is one type of bottom-gate structure, and is an example of a cross-sectional view of a structure called a channel-etch type. FIG. 2B is an example of a top view of the thin film transistor whose cross section taken along dotted line C1-C2 corresponds to FIG. 2A.

The thin film transistor 170 illustrated in FIG. 2A includes a gate electrode layer 101 over a substrate 100, a gate insulating layer 102 over the gate electrode layer 101, a stacked layer of oxide semiconductor layers over the gate insulating layer 102, a source and drain electrode layers 105a and 105b over the stacked layer of the oxide semiconductor layers, and a protective insulating layer 106 covering the stacked layer of the oxide semiconductor layers and the source and drain electrode layers 105a and 105b.

In this embodiment, over the gate insulating layer 102, an oxide semiconductor layer 103 containing $SiO_x$ as an insulating oxide (also referred to as a first oxide semiconductor layer) and a second oxide semiconductor layer are stacked in this order. Note that the second oxide semiconductor layer is a semiconductor layer having higher electric conductivity than the oxide semiconductor layer 103 containing an insulating oxide and functions as a buffer layer, an $n^+$ layer, and/or a source and drain regions. In FIG. 2A, the second oxide semiconductor layer is illustrated as a first buffer layer 104a and a second buffer layer 104b.

In this embodiment, the oxide semiconductor layer 103 containing an insulating oxide is formed with use of an oxide semiconductor target containing In (indium), Ga (gallium), and Zn (zinc), in which $SiO_2$ is contained at from 0.1 wt % to 10 wt % inclusive, preferably at from 1 wt % to 6 wt % inclusive. An insulating oxide contained in an oxide semiconductor makes an oxide semiconductor to be deposited easy to be amorphous. In addition, in the case where the oxide semiconductor film is subjected to thermal treatment, crystallization of the oxide semiconductor film can be suppressed.

Change in a structure of an oxide semiconductor containing In (indium), Ga (gallium), and Zn (zinc) which is so-called IGZO, by containing $SiO_2$ therein, was calculated by the classical molecular dynamics simulation. In the classical molecular dynamics method, empirical potential characterizing interaction between atoms is defined, whereby force acting on each atom is evaluated, and Newton's equation of motion is numerically solved, whereby motion (time-dependent change) of each atom can be deterministically tracked.

Hereinafter, calculation models and calculation conditions are described. Note that in this calculation, the Born-Mayer-Huggins potential was used.

A single crystal structure of $InGaZnO_4$ including 1680 atoms (see FIG. 7) and a structure of $InGaZnO_4$ including 1680 atoms in which 20 atoms of each of In, Ga, and Zn are substituted by Si atoms (see FIG. 8) were formed. In the Si-substituted model, Si atoms are contained at 3.57 atoms %

(2.34 wt %). The density of the single crystal model is 6.36 g/cm³, and the density of the Si-substituted model is 6.08 g/cm³.

At 1727° C. which is lower than the melting point of the InGaZnO₄ single crystal (about 2000° C. according to estimation by the classical molecular dynamics simulation), structure relaxation was performed by the classical molecular dynamics simulation at a fixed pressure (1 atm) for 150 psec (time step width 0.2 fsec×750000 steps). The radial distribution functions g (r) of the two structures were calculated. Note that the radial distribution function g (r) is a function representing the probability density atoms existing at a distance of r from one atom. As the correlation between atoms disappears, g (r) becomes closer to 1.

Figure 7:
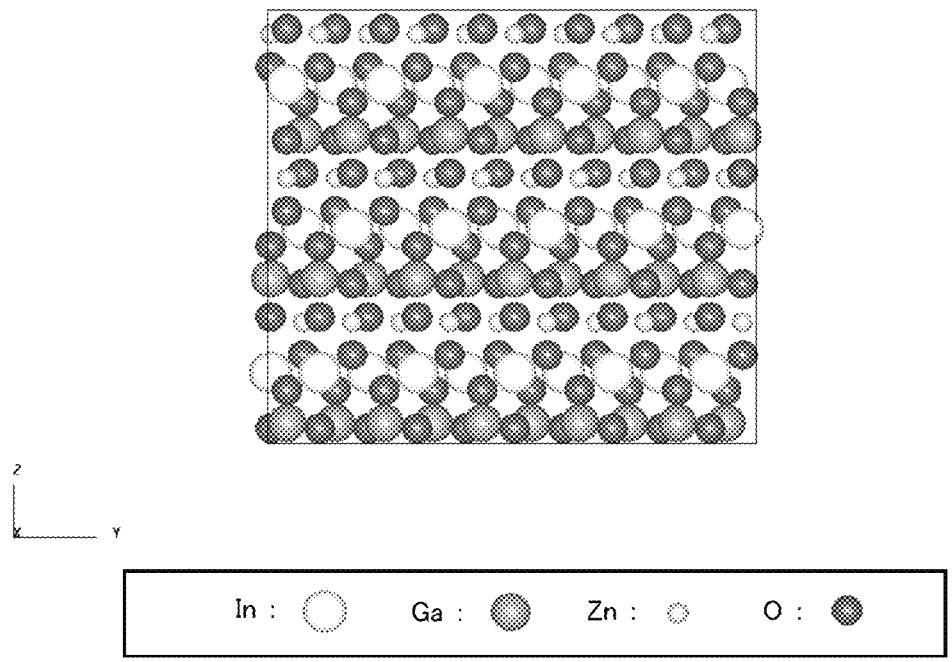
FIG. 7 is a model diagram showing a single crystal structure of $InGaZnO_4$.
Figure 8:
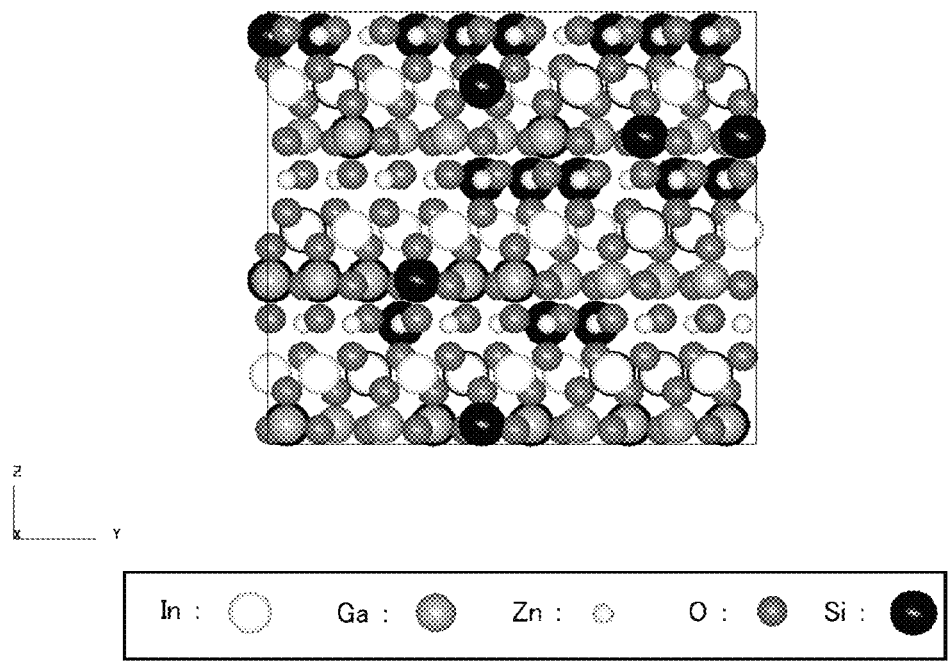
FIG. 8 is a diagram showing a Si-substituted model.
Figure 9:
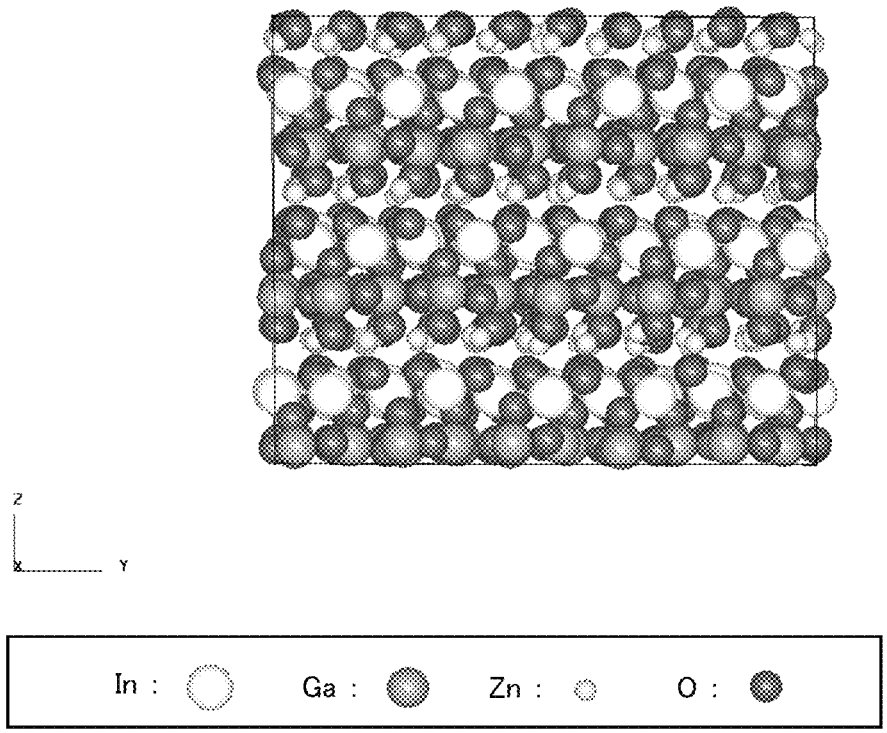
FIG. 9 is a diagram showing a final structure of a single crystal model.
Figure 10:
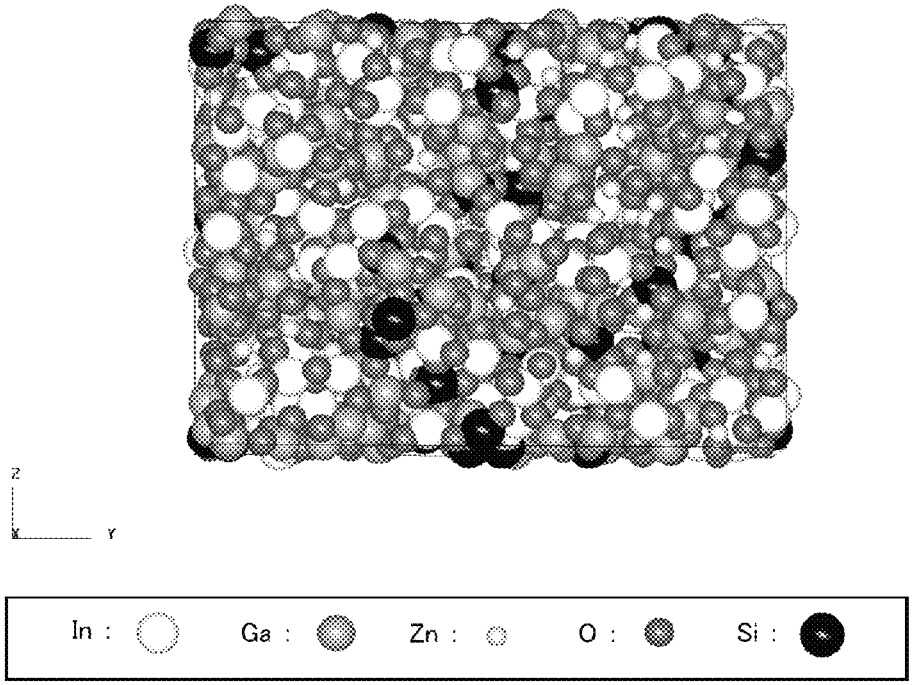
FIG. 10 is a diagram showing a final structure of a Si-substituted model.
Figure 11:
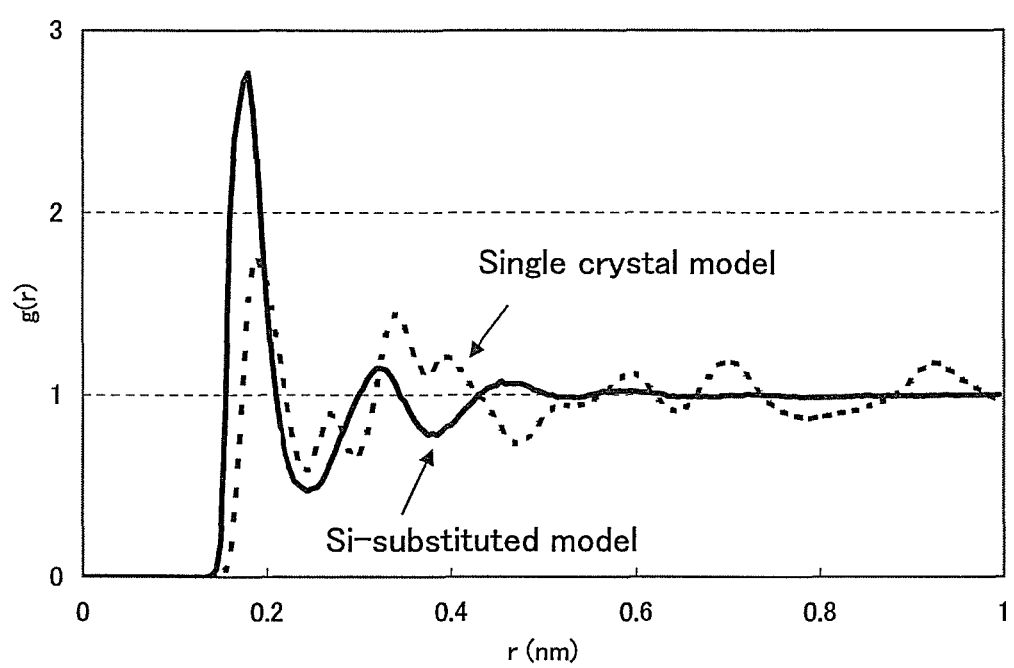
FIG. 11 is a graph showing a radical distribution function g (r) of each model.

FIG. 9 and FIG. 10 show final structures obtained by performing the classical molecular dynamics simulation for 150 psec on the above two calculation models of FIG. 7 and FIG. 8. In addition, FIG. 11 shows the radial distribution function g (r) in each structure.

The single crystal model shown in FIG. 9 is stable and keeps the crystal structure in the final structure, whereas the Si-substituted model shown in FIG. 10 is unstable, and it can be observed that the crystal structure is distorted with time and changes into an amorphous structure. As seen in FIG. 11, by comparing the radial distribution functions g (r) of the structural models, it is found that the single crystal model has peaks even at a long distance and the long-range order. On the other hand, it is found that in the Si-substituted model, the peak disappears at a distance of about 0.6 nm, and the Si-substituted model does not have the long-range order.

These calculation results indicate that in the case where $SiO_2$ is contained, IGZO with an amorphous structure is more stable than that with a crystalline structure, and IGZO is easily to be amorphous by containing $SiO_2$ in the IGZO. The IGZO thin film containing $SiO_2$ immediately after deposition, which is practically obtained by a sputtering method, is an amorphous semiconductor film. Thus, according to these calculation results, $SiO_2$ being contained can hinder crystallization even if thermal treatment is performed at high temperature, and can keep the amorphous structure.

Further, in the oxide semiconductor layer 103 containing $SiO_x$, the Si-element concentration in the film thickness direction has a gradient increasing in accordance with an increase in the distance from the gate electrode layer. In the case of the thin film transistor 170 shown in FIG. 2A in which the oxide semiconductor layer is disposed above the gate electrode layer, as for the concentration gradient of $SiO_x$ in the oxide semiconductor layer 103 containing $SiO_x$, a higher concentration region is located on the side which is distant from the gate electrode layer and a lower concentration region is located on the side which is close to the gate electrode layer. The concentration gradient of $SiO_x$ in the oxide semiconductor layer 103 containing $SiO_x$ changes step-by-step or continuously.

By employing the oxide semiconductor layer containing $SiO_x$ and having a concentration gradient, as an oxide semiconductor layer, a main flow of drain current can be led to the boundary vicinity between the oxide semiconductor layer 103 containing $SiO_x$ and the gate insulating layer 102 (low Si-element concentration region) when the thin film transistor 170 is in the ON state, so that the field-effect mobility can be increased. In addition, when the thin film transistor 170 is in the OFF state, drain current mainly flows through a portion of the oxide semiconductor layer 103 containing $SiO_x$ (high Si-element concentration region), which is subjected to etching treatment, so that off-current does not flow through the low Si-element concentration region which has higher electric conductivity than the high Si-element concentration region, thereby decreasing off-current.

The oxide semiconductor layer 103 containing $SiO_x$ is not limited to an In—Ga—Zn—O based oxide semiconductor, and for example, any of the following can be used: an In—Sn—Zn—O based oxide semiconductor, an In—Al—Zn—O based oxide semiconductor, a Sn—Ga—Zn—O based oxide semiconductor, an Al—Ga—Zn—O based oxide semiconductor, a Sn—Al—Zn—O based oxide semiconductor, an In—Zn—O based oxide semiconductor, a Sn—Zn—O based oxide semiconductor, an Al—Zn—O based oxide semiconductor, an In—O based oxide semiconductor, a Sn—O based oxide semiconductor, and a Zn—O based oxide semiconductor. The same or similar effect as/to the above can be obtained by employing the oxide semiconductor layer containing $SiO_x$ and having a concentration gradient, as the oxide semiconductor layer.

Figure 2C:
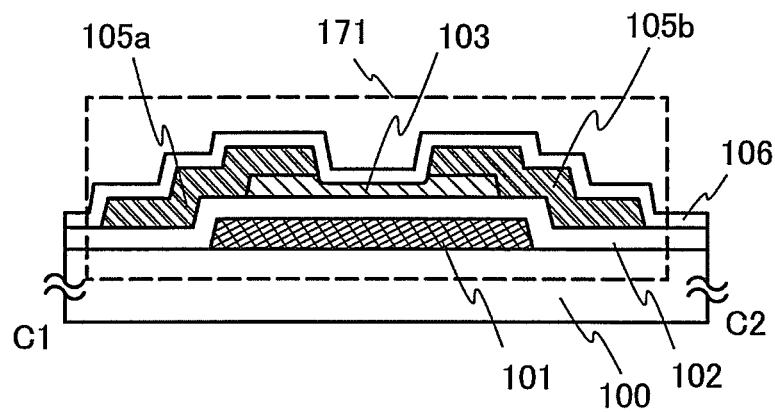

Further, the present invention is not limited to the above-described structure including the first buffer layer 104a and the second buffer layer 104b; a structure in which a buffer layer is not provided may be employed. An example of a cross-sectional view of a thin film transistor 171 in that case is illustrated in FIG. 2C. Note that in FIG. 2C, the structure is the same as FIG. 2A, except in that a buffer layer is not provided, and therefore, the same reference numerals denote the same portions as the corresponding portions in FIG. 2A.

Hereinafter, an example of manufacturing a display device using the above-described thin film transistor 170 as a switching element of a pixel portion is described.

First, a gate electrode layer 101 is provided over a substrate 100 having an insulating surface. A glass substrate is used as the substrate 100 having an insulating surface. The gate electrode layer 101 can be formed using a single layer or a stacked layer using any of a metal material such as molybdenum, titanium, chromium, tantalum, tungsten, aluminum, copper, neodymium, or scandium, and an alloy material which contains any of these materials as a main component. Note that when the gate electrode layer 101 is formed, a capacitor wiring 108 of the pixel portion and a first terminal 121 of a terminal portion are also formed.

For example, a stacked-layer structure of two layers of the gate electrode layer 101 is preferably a two-layer structure where a molybdenum layer is stacked over an aluminum layer, a two-layer structure where a molybdenum layer is stacked over a copper layer, a two-layer structure where a titanium nitride layer or a tantalum nitride layer is stacked over a copper layer, or a two-layer structure where a titanium nitride layer and a molybdenum layer are stacked. Alternatively, a stacked structure where a copper oxide layer including Ca which is to be a barrier layer is stacked over a copper layer including Ca, or a stacked structure where a copper oxide layer including Mg which is to be a barrier layer is stacked over a copper layer including Mg can be given. As a three-layer structure, a stacked-layer structure where a tungsten layer or a tungsten nitride layer, an alloy of aluminum and silicon or an alloy of aluminum and titanium, and a titanium nitride layer or a titanium layer are stacked is preferable.

Next, a gate insulating layer 102 covering the gate electrode layer 101 is formed. The gate insulating layer 102 is formed to have a thickness of 50 nm to 400 nm by a sputtering method, a PCVD method, or the like.

For example, as the gate insulating layer 102, a 100-nm-thick silicon oxide film is formed by a sputtering method. It is needless to say that the gate insulating layer 102 is not limited to such a silicon oxide film. The gate insulating layer 102 may be formed using a single layer or a stacked layer using another insulating film such as a silicon oxynitride film, a silicon nitride film, an aluminum oxide film, an aluminum nitride film, an aluminum oxynitride film, or a tantalum oxide film. In the case of having a stacked structure, for example, a silicon nitride film may be formed by a PCVD method, and a silicon oxide film may be formed by a sputtering film thereover. In the case where a silicon oxynitride film, a silicon nitride film, or the like is used as the gate insulating layer 102, an impurity from the glass substrate, sodium for example, can be blocked from diffusing into and entering an oxide semiconductor to be formed later above the gate insulating layer 102.

Next, an oxide semiconductor film containing $SiO_x$ is formed over the gate insulating layer 102. The oxide semiconductor film is formed with use of an oxide semiconductor target in which $SiO_2$ is contained at from 0.1 wt % to 10 wt % inclusive, preferably at from 1 wt % to 6 wt % inclusive. Note that any other insulating impurity can be contained in the oxide semiconductor target, instead of $SiO_2$, and any of the following can be used: an insulating oxide typified by germanium oxide or aluminum oxide, an insulating nitride typified by silicon nitride or aluminum nitride, an insulating oxynitride typified by silicon oxynitride or aluminum oxynitride, and the like. Such an insulating impurity contained in an oxide semiconductor makes an oxide semiconductor to be deposited easy to be amorphous. In addition, in the case where the oxide semiconductor film is subjected to thermal treatment, crystallization of the oxide semiconductor film can be suppressed.

In this embodiment, an oxide semiconductor film having a gradient of the Si-element concentration (a first In—Ga—Zn—O based non-single-crystal film) is formed as follows: two of an oxide semiconductor target containing In (indium), gallium (Ga), and Zn (zinc), in which $SiO_2$ is contained at 2 wt % and an oxide semiconductor target containing In (indium), gallium (Ga), and Zn (zinc), in which $SiO_2$ is contained at 5 wt % are disposed in the same chamber and changed by a shutter to be used, so that successive film deposition is performed in the same chamber.

An oxide semiconductor target containing In (indium), gallium (Ga), and Zn (zinc) can be deposited either of an RF sputtering method or a DC sputtering method. Therefore, two targets of an artificial quartz target and an oxide semiconductor target containing In (indium), gallium (Ga), and Zn (zinc) may be disposed in the same chamber and sputtered at the same time by an RF sputtering method, that is, so-called co-sputtering may be performed to form the oxide semiconductor film having a gradient of the Si-element concentration (the first In—Ga—Zn—O based non-single-crystal film). A silicon target may be used instead of the artificial quartz to perform co-sputtering. Co-sputtering enables an oxide semiconductor film containing $SiO_x$ to be formed without using an oxide semiconductor target containing $SiO_2$.

Next, an oxide semiconductor film (a second In—Ga—Zn—O based non-single-crystal film) having lower resistance than the oxide semiconductor film containing $SiO_x$ is formed by a sputtering method. In this embodiment, sputtering is performed using a target of $In_2O_3:Ga_2O_3:ZnO=1:1:1$ under film deposition conditions where the pressure is 0.4 Pa, the power is 500 W, the deposition temperature is room temperature, and an argon gas is introduced at a flow rate of 40 sccm. Despite the use of the target in which $In_2O_3:Ga_2O_3:ZnO=1:1:1$, an In—Ga—Zn—O based non-single-crystal film including crystal grains each with a size of 1 to 10 nm immediately after the deposition may be formed. The presence, density, and diameter of crystal grains can be controlled by adjusting the deposition conditions of reactive sputtering as appropriate, such as the composition ratio of a target, the deposition pressure (0.1 Pa to 2.0 Pa), the power (250 W to 3000 W: 8 inches φ), or the temperature (room temperature to 100° C.). The diameter of each of the crystal grains can be controlled within a range of 1 to 10 nm The thickness of the second In—Ga—Zn—O based non-single-crystal film is set to 5 to 20 nm. In the case where crystal grains are contained in the second In—Ga—Zn—O based non-single-crystal film, the size of each crystal grain does not exceed the film thickness. In this embodiment, the thickness of the second In—Ga—Zn—O based non-single-crystal film is 5 nm. The second In—Ga—Zn—O based non-single-crystal film is deposited in a rare gas (such as argon or helium) atmosphere (or an atmosphere containing oxygen at 10% or less and an argon gas at 90% or more).

Examples of a sputtering method include an RF sputtering method in which a high-frequency power source is used as a sputtering power source, a DC sputtering method, and a pulsed DC sputtering method in which a bias is applied in a pulsed manner.

In addition, there is a multi-source sputtering apparatus in which a plurality of targets of different materials can be set. With the multi-source sputtering apparatus, films of different materials can be deposited to be stacked in the same chamber, and a film of plural kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by a sputtering method, there are also a reactive sputtering method in which a target substance and a sputtering gas component are chemically reacted with each other during deposition to form a thin compound film thereof, and a bias sputtering method in which a voltage is also applied to a substrate during deposition.

Next, a photolithography step is performed. A resist mask is formed, and the first In—Ga—Zn—O based non-single-crystal film and the second In—Ga—Zn—O based non-single-crystal film are etched.

Next, a photolithography step is performed. A resist mask is formed, and an unnecessary portion (part of the gate insulating layer) is removed by etching, so that a contact hole which reaches an electrode layer or a wiring formed of the same material as the gate electrode layer is formed. This contact hole is provided for direct contact with a conductive film formed later. For example, in the driver circuit portion, a contact hole is formed when a thin film transistor whose gate electrode layer is direct contact with the source or drain electrode layer or a terminal that is electrically connected to a gate wiring of a terminal portion is formed. Note that an example of forming the contact hole for direct connection with the conductive film to be formed later by the photolithography step is described in this embodiment, but there is no particular limitation. A contact hole reaching the gate electrode layer may be formed later in the same step as the step in which a contact hole for connection to a pixel electrode is formed, and electrical connection may be performed with use of the same material as the pixel electrode. When the electrical connection is performed with use of the same material as the pixel electrode, the number of masks can be reduced by one.

Next, a conductive film using a metal material is formed over the second In—Ga—Zn—O based non-single-crystal film by a sputtering method or a vacuum evaporation method.

As the material of the conductive film, there are an element selected from Al, Cr, Ta, Ti, Mo, and W, an alloy containing any of these elements, an alloy film containing a combination of any of these elements, and the like. Further, in the case of performing thermal treatment at 200° C. to 600° C., heat resistance against such thermal treatment is preferably provided for the conductive film. Since solo use of Al brings disadvantages such as low heat resistance and being easily corroded, aluminum is used in combination with a conductive material having heat resistance. As the conductive material having heat resistance which is used in combination with Al, any of the following materials may be used: an element selected from titanium (Ti), tantalum (Ta), tungsten (W), molybdenum (Mo), chromium (Cr), neodymium (Nd), and scandium (Sc), an alloy containing any of these above elements, an alloy film containing these elements in combination, and a nitride containing any of these above elements as a component.

In this embodiment, the conductive film has a single-layer structure of a titanium film. Alternatively, the conductive film may have a two-layer structure where a titanium film may be stacked over an aluminum film. Still alternatively, the conductive film may have a three-layer structure where a Ti film, a film of aluminum containing Nd (Al—Nd) is stacked over the Ti film, and a Ti film is formed over these films. The conductive film may have a single-layer structure of a film of aluminum containing silicon.

Next, a photolithography step is performed. A resist mask is formed, and unnecessary portions are removed by etching, so that the source and drain electrode layers 105a and 105b, and the first buffer layer 104a and the second buffer layer 104b which function as the source and drain regions are formed in the pixel portion and a source and drain electrode layers and a source and drain regions are formed in the driver circuit portion. An etching method at this time is wet etching or dry etching. For example, in the case where an aluminum film or an aluminum-alloy film is used as the conductive film, wet etching using a mixed solution of phosphoric acid, acetic acid, and nitric acid can be performed. In this embodiment, by wet-etching using an ammonia-hydrogen peroxide solution (hydrogen peroxide:ammonium:water=5:2:2), the conductive film that is a Ti film is etched, so that the source and drain electrode layers are formed, and the second In—Ga—Zn—O based non-single-crystal film is etched, so that the first buffer layer 104a and the second buffer layer 104b are formed. In this etching step, an exposed region of the oxide semiconductor film containing $SiO_x$ is also partly etched, so that the oxide semiconductor layer 103 containing $SiO_x$ is formed.

In addition, in this photolithography step, a second terminal 122 formed using the same material as the source and drain electrode layers 105a and 105b is left in the terminal portion. Note that the second terminal 122 is electrically connected to a source wiring (a source wiring including the source or drain electrode layer 105a or 105b).

Through the above steps, the thin film transistor 170 in which the oxide semiconductor layer 103 containing $SiO_x$ serves as a channel formation region can be formed in the pixel portion.

In addition, in the terminal portion, a connection electrode 120 is directly connected to the first terminal 121 of the terminal portion through a contact hole formed in the gate insulating film. Note that although not illustrated in this embodiment, a source or drain wiring of the thin film transistor of the driver circuit is directly connected to the gate electrode through the same steps as the above-described steps.

Next, thermal treatment (including photo-annealing) is performed at 200° C. to 600° C., typically, 300° C. to 500° C.

In this embodiment, thermal treatment is performed in a nitrogen atmosphere in a furnace at 350° C. for one hour. Through this thermal treatment, atomic rearrangement occurs in the In—Ga—Zn—O based non-single-crystal film. In addition, the oxide semiconductor layer 103 containing $SiO_x$ can be prevented from being crystallized in thermal treatment, by $SiO_x$ being contained; thus the oxide semiconductor layer 103 can be kept to be amorphous. Further, $SiO_x$ contained in the oxide semiconductor layer 103 containing $SiO_x$ enables the oxide semiconductor layer 103 containing $SiO_x$ to be subjected to thermal treatment at relatively high temperature for a long period. Note that there is no particular limitation on when to perform the thermal treatment, as long as it is performed after the second In—Ga—Zn—O based non-single-crystal film is formed; for example, the thermal treatment may be performed after a pixel electrode is formed.

Next, the resist mask is removed, and the protective insulating layer 106 covering the thin film transistor 170 is formed.

Next, a photolithography step is performed. A resist mask is formed, and the protective insulating layer 106 is etched, so that a contact hole reaching the source or drain electrode layer 105a or 105b is formed. In addition, a contact hole reaching the second terminal 122 and a contact hole reaching the connection electrode 120 are also formed by this etching.

Next, the resist mask is removed, and then a transparent conductive film is formed. The transparent conductive film is formed using indium oxide ($In_2O_3$), indium tin oxide ($In_2O_3$—$SnO_2$, abbreviated as ITO), or the like by a sputtering method, a vacuum evaporation method, or the like. Etching treatment of such a material is performed with a hydrochloric acid based solution. However, since a residue is easily generated particularly in etching ITO, indium oxide-zinc oxide alloy ($In_2O_3$—$ZnO$) may be used to improve etching processability.

Next, a photolithography step is performed. A resist mask is formed, and an unnecessary portion is removed by etching, so that a pixel electrode layer 110 is formed. In this photolithography step, a storage capacitor is formed by the capacitor wiring 108 and the pixel electrode layer 110 using the gate insulating layer 102 and the protective insulating layer 106 in the capacitor portion as a dielectric. Furthermore, in this photolithography step, the first terminal and the second terminal are covered with the resist mask so that transparent conductive films 128 and 129 remain in the terminal portion. The transparent conductive films 128 and 129 serve as electrodes or wirings that are used for connection with an FPC. The transparent conductive film 128 formed over the connection electrode 120 that is directly connected to the first terminal 121 serves as a terminal electrode for connection which functions as an input terminal for the gate wiring. The transparent conductive film 129 formed over the second terminal 122 serves as a terminal electrode for connection which functions as an input terminal for the source wiring.

Described in this embodiment is an example in which the storage capacitor is formed by the capacitor wiring 108 and the pixel electrode layer 110 by using the gate insulating layer 102 and the protective insulating layer 106 as a dielectric is described; however, there is no particular limitation. A structure may also be employed, in which an electrode formed using the same material as the source and drain electrodes is provided above a capacitor wiring and a storage capacitor is formed by the electrode and the capacitor wiring with the gate insulating layer 102 interposed therebetween as a dielectric, and the electrode and the pixel electrode layer 110 are electrically connected.

Figure 3:
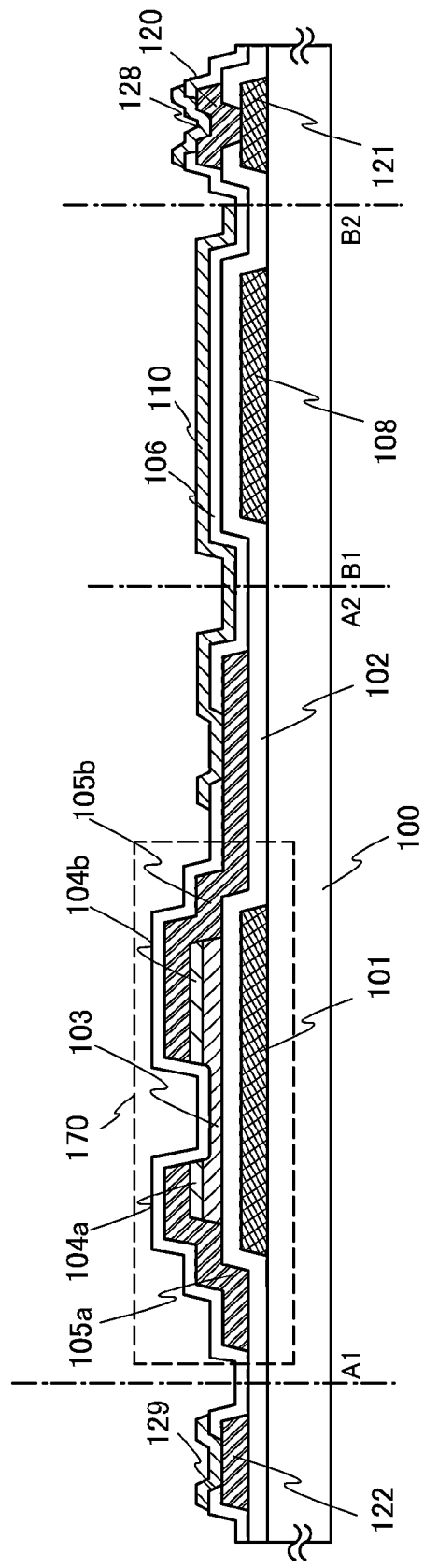
FIG. 3 is a cross-sectional view illustrating an embodiment of the present invention.

Next, the resist mask is removed. FIG. 3 is a cross-sectional view at this stage. Note that, a top view of the thin film transistor 170 in the pixel portion at this stage corresponds to FIG. 4.

Figure 4:
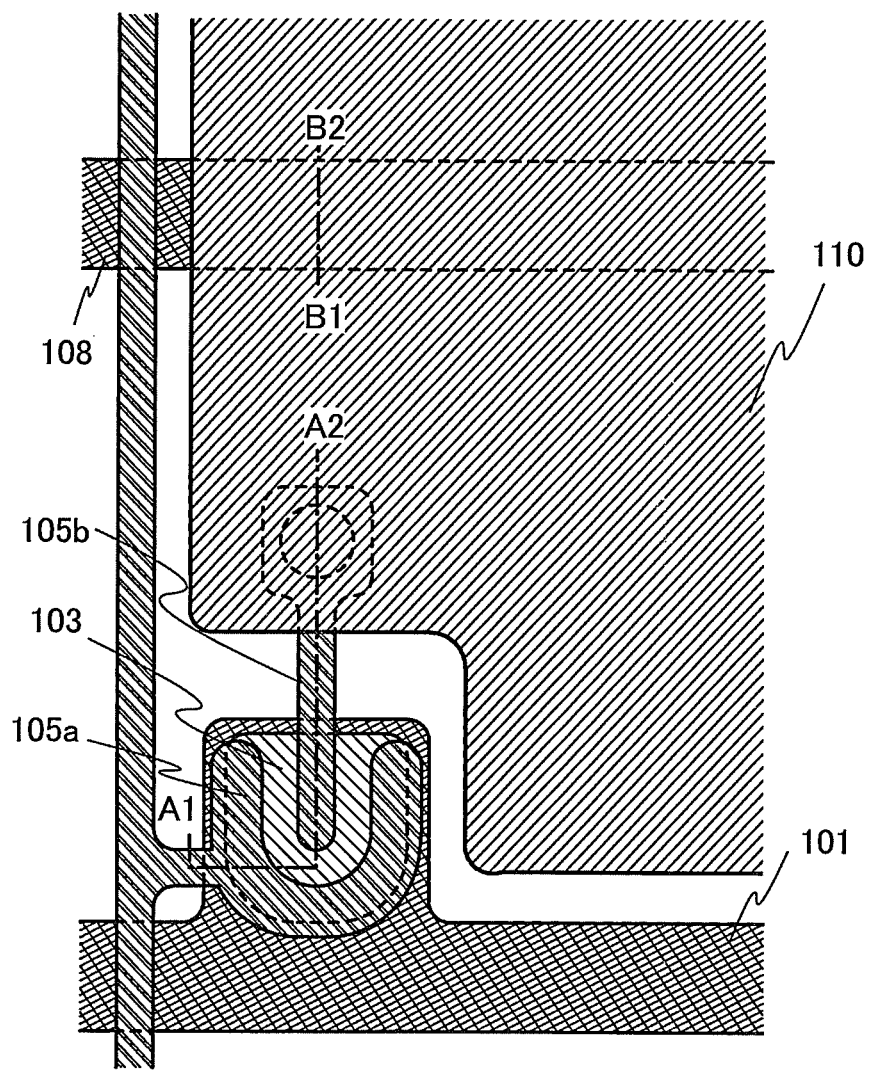
FIG. 4 is a top view illustrating an embodiment of the present invention.

A cross-sectional view taken along line A1-A2 and line B1-B2 of FIG. 4 corresponds to FIG. 3. FIG. 3 illustrates a cross-sectional structure of the thin film transistor 170 in the pixel portion, a cross-sectional structure of a capacitor portion in the pixel portion, and a cross-sectional structure of the terminal portion.

Figure 5A:
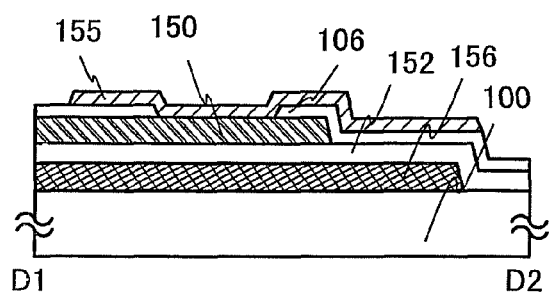
FIGS. 5A and 5B are a cross-sectional view and a top view illustrating an embodiment of the present invention.
Figure 5B:
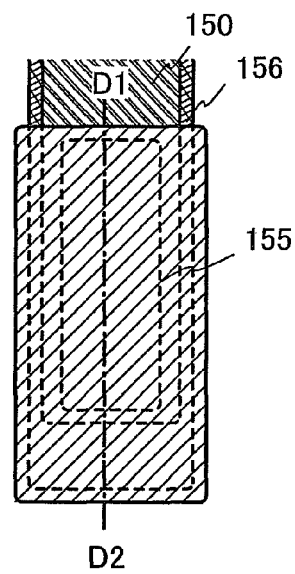

Further, FIGS. 5A and 5B are a cross-sectional view of a source wiring terminal portion and a top view thereof, respectively. FIG. 5A is a cross-sectional view taken along line D1-D2 of FIG. 5B. In FIG. 5A, a transparent conductive film 155 formed over a protective insulating film 106 is a connection terminal electrode which functions as an input terminal. Furthermore, in FIG. 5A, in the terminal portion, an electrode 156 formed using the same material as the gate wiring is located below and overlapped with a second terminal 150, which is electrically connected to the source wiring, with a gate insulating layer 152 interposed therebetween. The electrode 156 is not electrically connected to the second terminal 150. When the electrode 156 is set to, for example, floating state, GND, or 0 V such that the potential of the electrode 156 is different from the potential of the second terminal 150, a capacitor for preventing noise or static electricity can be formed. The second terminal 150 is electrically connected to the transparent conductive film 155 with the protective insulating film 106 interposed therebetween.

A plurality of gate wirings, source wirings, and capacitor wirings are provided depending on the pixel density. Also in the terminal portion, the first terminal at the same potential as the gate wiring, the second terminal at the same potential as the source wiring, the third terminal at the same potential as the capacitor wiring, and the like are each arranged in plurality. There is no particular limitation on the number of each of the terminals, and the number of the terminals can be determined as appropriate.

Thus, the pixel portion which includes the thin film transistor 170 including an oxide semiconductor layer containing $SiO_x$ and the storage capacitor, and the terminal portion can be manufactured. In addition, a driver circuit can be formed over the same substrate.

When an active matrix liquid crystal display device is manufactured, an active matrix substrate and a counter substrate provided with a counter electrode are bonded to each other with a liquid crystal layer interposed therebetween. Note that a common electrode is provided over the active matrix substrate to be electrically connected to the counter electrode provided on the counter substrate, and a terminal is provided in a terminal portion to be electrically connected to the common electrode. This terminal is provided for setting the common electrode at a fixed potential such as GND or 0 V.

Figure 6:
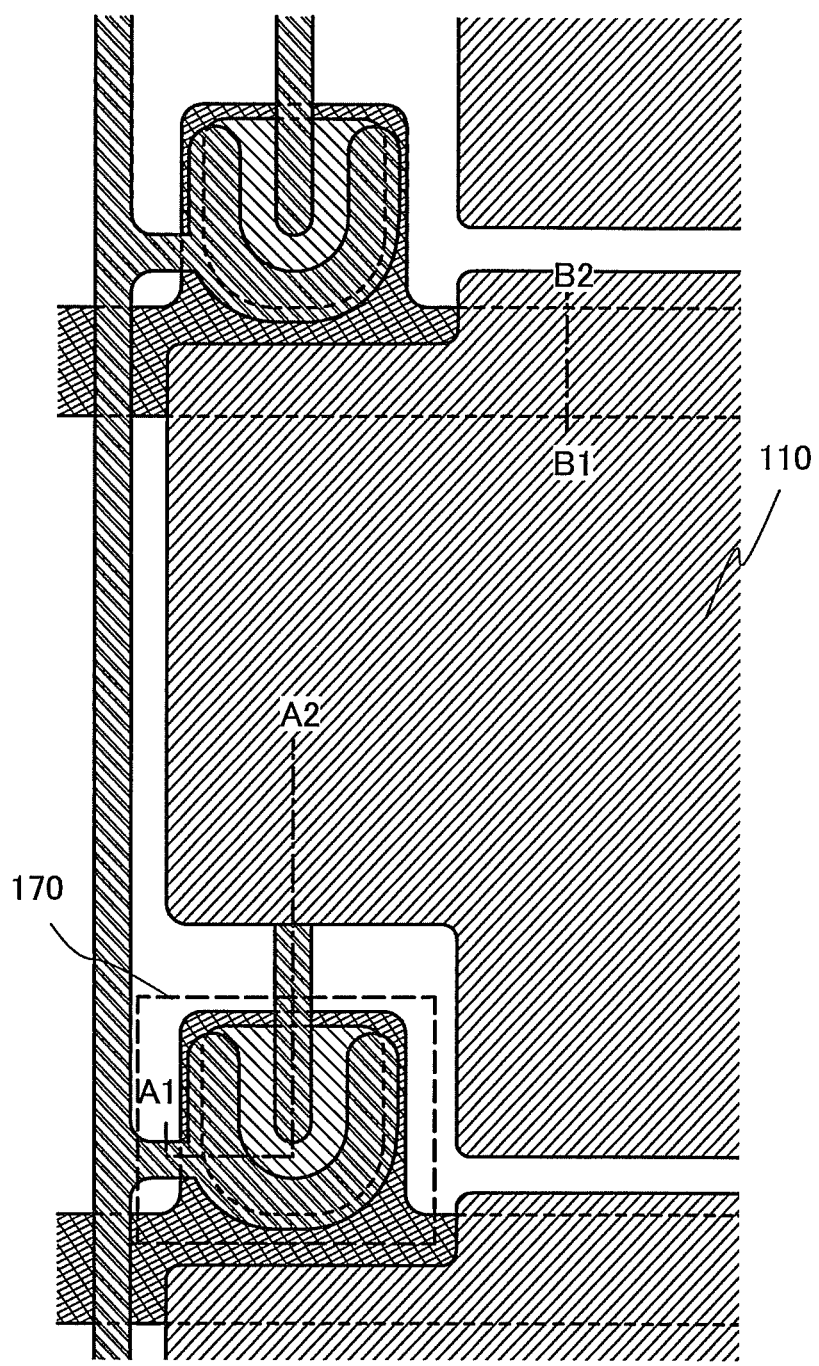
FIG. 6 is a top view illustrating an embodiment of the present invention.

Further, in this embodiment, the pixel structure is not limited to that of FIG. 4. An example of a top view different from FIG. 4 is illustrated in FIG. 6. FIG. 6 illustrates an example in which a capacitor wiring is not provided but a pixel electrode overlaps with a gate wiring of an adjacent pixel, with a protective insulating film and a gate insulating layer interposed therebetween to form a storage capacitor. In that case, a capacitor wiring and a third terminal which is connected to the capacitor wiring can be omitted. Note that in FIG. 6, the same portions as portions in FIG. 4 are denoted by the same reference numerals.

In an active matrix liquid crystal display device, display patterns are formed on a screen by driving pixel electrodes arranged in a matrix. In more detail, when voltage is applied between a selected pixel electrode and a counter electrode that corresponds to the selected pixel electrode, a liquid crystal layer provided between the pixel electrode and the counter electrode is optically modulated, and this optical modulation is recognized as a display pattern.

In displaying moving images, a liquid crystal display device has a problem that a long response time of liquid crystal molecules themselves causes afterimages or blurring of moving images. In order to improve the moving-image characteristics of the liquid crystal display device, a driving method called black insertion is employed in which color black is displayed on the whole screen every other frame period.

Moreover, a driving method called double-frame rate driving may be employed in which the vertical synchronizing frequency is 1.5 times or more, preferably twice or more as high as a conventional vertical synchronizing frequency, whereby the moving-image characteristics are improved.

Further alternatively, in order to improve the moving-image characteristics of a liquid crystal display device, a driving method may be employed in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

According to this embodiment, a display device having high electrical characteristics and high reliability can be provided at low costs.

This embodiment can be combined with Embodiment 1 as appropriate.

[Embodiment 3]

In Embodiment 3, an example in which light exposure using a multi-tone mask is performed so that the number of masks is decreased will be described.

In addition, described is an example in which indium that is a rare metal the amount of production of which is limited is not used in the composition of an oxide semiconductor layer. In addition, described is an example in which gallium that is one kind of rare metal is also not used as a compositional element of an oxide semiconductor layer.

A multi-tone (high-tone) mask can achieve three levels of light exposure: an exposed portion, a half-exposed portion, and an unexposed portion. Light has a plurality of intensity levels by passing through the multi-tone mask. One-time light exposure and development process enables a resist mask with regions with a plurality of thicknesses (typically, two levels of thickness) to be formed. Accordingly, by using a multi-tone mask, the number of light-exposure masks can be reduced.

As typical examples of a multi-tone mask, there are a gray-tone mask, a half-tone mask, and the like.

A gray-tone mask includes a light-transmitting substrate, and a light-shielding portion and a diffraction grating which are formed over the light-transmitting substrate. The light transmittance of the light-shielding portion is 0%. On the other hand, the light transmittance of the diffraction grating can be controlled by setting an interval between light-transmitting portions in slit forms, dot forms, or mesh forms to an interval less than or equal to the resolution limit of light used for the exposure. Note that the diffraction grating can be either in a regular slit form, a regular dot form, or a regular mesh form, or in an irregular slit form, an irregular dot form, or an irregular mesh form.

A half-tone mask includes a light-transmitting substrate, and a semi-transmissive portion and a light-shielding portion which are formed over the light-transmitting substrate. The semi-transmissive portion can be formed using MoSiN, MoSi, MoSiO, MoSiON, CrSi, or the like. The light-shielding portion can be formed using a light-shielding material which absorbs light, such as chromium or chromium oxide. When the half-tone mask is irradiated with light for exposure, the light transmittance of the light-shielding portion is 0% and the light transmittance of a region where neither the light-shielding portion nor the semi-transmissive portion is provided is 100%. The light transmittance of the semi-transmissive portion can be controlled in the range of 10% to 70%. The light transmittance of the semi-transmissive portion can be controlled by the material of the semi-transmissive portion.

FIGS. 12A to 12E correspond to cross-sectional views illustrating steps for manufacturing a thin film transistor 360.

Figure 12A:
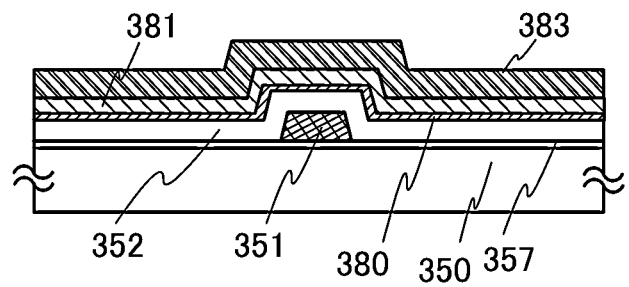
FIGS. 12A to 12E are cross-sectional views illustrating manufacturing steps of an embodiment of the present invention.

In FIG. 12A, an insulating film 357 is provided over a substrate 350 and a gate electrode layer 351 is provided over the insulating film 357. In this embodiment, a silicon oxide film (with a thickness of 100 nm) is used as the insulating film 357. Over the gate electrode layer 351, a gate insulating layer 352, an oxide semiconductor film 380, an oxide semiconductor film 381 containing $SiO_x$, and a conductive film 383 are stacked in this order. In this embodiment, an oxide semiconductor containing neither of indium and gallium, typically a Sn—Zn—O based oxide semiconductor, an Al—Zn—O based oxide semiconductor, a Sn—Al—Zn—O based oxide semiconductor, and/or a Zn—O based oxide semiconductor are/is used as the oxide semiconductor film 380 and the oxide semiconductor film 381 containing $SiO_x$. In this embodiment, a Sn—Zn—O based oxide semiconductor formed by a sputtering method is used as the oxide semiconductor film 380, and a Sn—Zn—O based oxide semiconductor is used as the oxide semiconductor film 381 containing $SiO_x$.

A mask 384 is formed over the gate insulating layer 352, the oxide semiconductor film 380, the oxide semiconductor film 381 containing $SiO_x$, and the conductive film 383.

In Embodiment 3, an example is described in which light exposure using a multi-tone (multi-tone) mask is performed to form the mask 384.

Figure 12B:
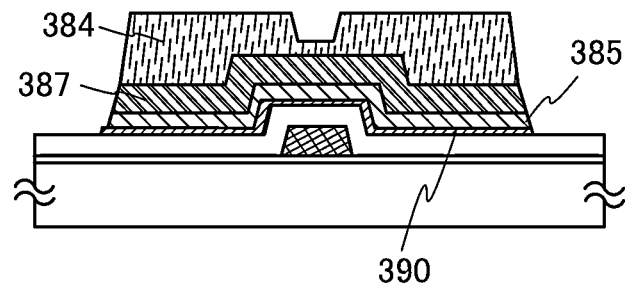
Figure 12C:
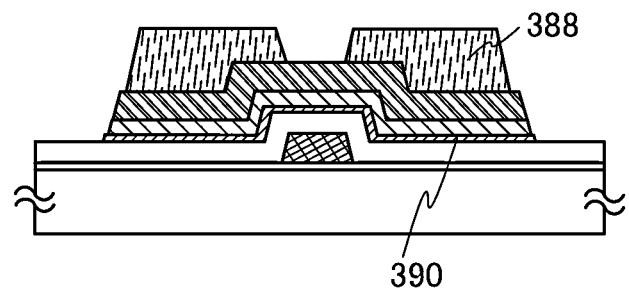

The light exposure is performed using the multi-tone mask through which light has a plurality of intensity levels, and then development is performed, whereby the mask 384 having regions with different levels of thickness can be formed as shown in FIG. 12B. The number of light-exposure masks can be reduced by using a multi-tone mask.

Next, a first etching step is performed using the mask 384 to etch the oxide semiconductor film 380, the oxide semiconductor film 381 containing $SiO_x$, and the conductive film 383 into an island shape. Accordingly, a patterned oxide semiconductor layer 390, a patterned oxide semiconductor layer 385 containing $SiO_x$, and a patterned conductive layer 387 can be formed (see FIG. 12B).

Next, ashing is conducted on the mask 384. As a result, the area and thickness of the mask are reduced. At this time, the resist of the mask in a region with a small thickness (a region overlapping with part of the gate electrode layer 351) is removed, and divided masks 388 can be formed (see FIG. 12C).

Figure 12D:
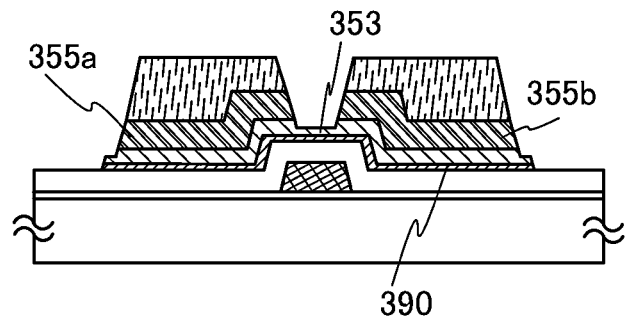

A second etching step is performed using the masks 388 to etch the oxide semiconductor layer 385 containing $SiO_x$ and the conductive layer 387, so that a semiconductor layer 353 containing $SiO_x$ and a source and drain electrode layers 355a and 355b are formed (see FIG. 12D). Note that the semiconductor layer 353 containing $SiO_x$ is partly etched to become a semiconductor layer having a groove (depression) and also having an end portion which is partly etched and exposed to outside.

When the first etching step is performed on the oxide semiconductor film 381 containing $SiO_x$ and the conductive film 383 by dry-etching, the oxide semiconductor film 381 containing $SiO_x$ and the conductive film 383 are etched anisotropically, which makes the end portions of the masks 384 and the end portions of the oxide semiconductor layer 385 containing $SiO_x$ and the conductive layer 387 to be aligned with each other so as to become continuous.

Similarly, when the second etching step is performed on the oxide semiconductor layer 385 containing $SiO_x$ and the conductive layer 387 by dry-etching, the oxide semiconductor layer 385 containing $SiO_x$ and the conductive layer 387 are etched anisotropically, which makes the end portions of the masks 388, one of the end portion of the depression and the end portion in the etched region of the oxide semiconductor layer 353 containing $SiO_x$, and the end portion of one of the source and drain electrode layers 355a and 355b to be aligned with each other so as to become continuous.

Shown in Embodiment 3 is the case where the semiconductor layer 353 containing $SiO_x$ and the source and drain electrode layers 355a and 355b have the same tapered angle at the respective end portions and are stacked so that the end portions are continuous. However, since the etching rates thereof are different depending on the etching condition and the materials of the oxide semiconductor layer and the conductive layer, the tapered angles may be different and the end portions is not necessarily continuous.

After that, the masks 388 are removed.

Figure 12E:
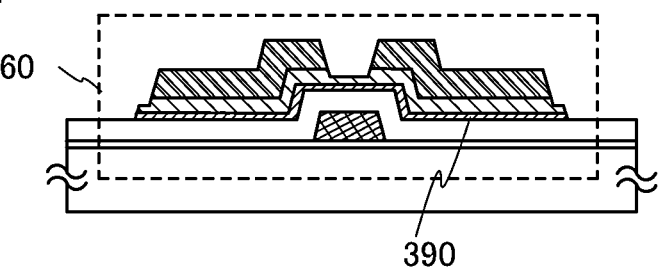

Next, heating is performed at 200° C. to 600° C. in an atmosphere containing oxygen is performed (see FIG. 12E).

Through the above process, the channel etch type thin film transistor 360 in which the semiconductor layer 353 containing $SiO_x$ is stacked over the oxide semiconductor layer 390 can be manufactured.

The use of a resist mask having regions with a plurality of thicknesses (typically, two levels of thickness) formed using a multi-tone mask as in this embodiment enables the number of resist masks to be reduced, which leads to simplification of the manufacturing process and cost reduction.

Further, indium and gallium are not used in the oxide semiconductor layer as described in Embodiment 3, thereby reducing the cost for a target of an oxide semiconductor, which leads to cost reduction.

Accordingly, a semiconductor device can be manufactured at low cost with high productivity.

Described in Embodiment 3 is an example in which a thin film transistor in a driver circuit and a thin film transistor in a pixel portion are both the inverted staggered thin film transistors 360 each having a stacked-layer structure in which the semiconductor layer 353 containing $SiO_x$ is stacked over the oxide semiconductor layer 390. That is, this embodiment is an example in which respective structures of thin film transistors in a driver circuit and in a pixel portion in the case where the circuits are formed over the same substrate are the same or substantially the same as each other.

This embodiment can be combined with the structure described in any other Embodiment, as appropriate.

For example, although the example of the stacked-layer structure in which a Sn—Zn—O based oxide semiconductor formed by a sputtering method is used as the oxide semiconductor film 380 and a Sn—Zn—O based oxide semiconductor is used as the oxide semiconductor film 381 containing $SiO_x$ is described in Embodiment 3, the present invention is not limited thereto; a single-layer structure as described in Embodiment 2 may be employed and for example, a thin film transistor using a Sn—Zn—O based oxide semiconductor containing $SiO_x$ may be manufactured.

[Embodiment 4]

In Embodiment 4, an example of a channel stop type thin film transistor 430 will be described using FIGS. 13A and 13B. FIG. 13B is an example of a top view of a thin film transistor, cross-sectional view along dotted line Z1-Z2 of which corresponds to FIG. 13A. Described is an example in which an oxide semiconductor material containing no indium is used in an oxide semiconductor layer in the thin film transistor 430.

Figure 13A:
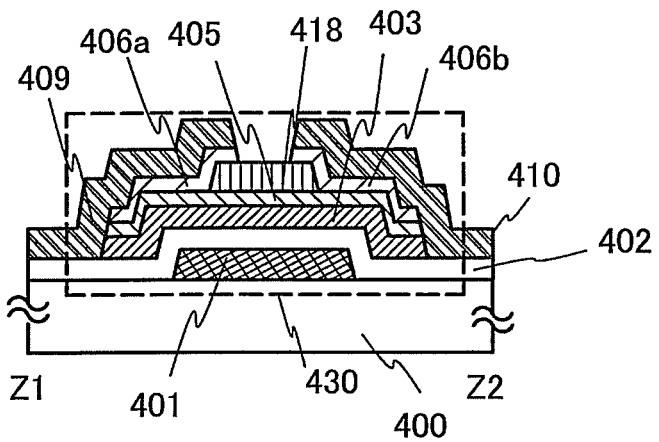
FIGS. 13A to 13C are cross-sectional views and a top view each illustrating an embodiment of the present invention.
Figure 13B:
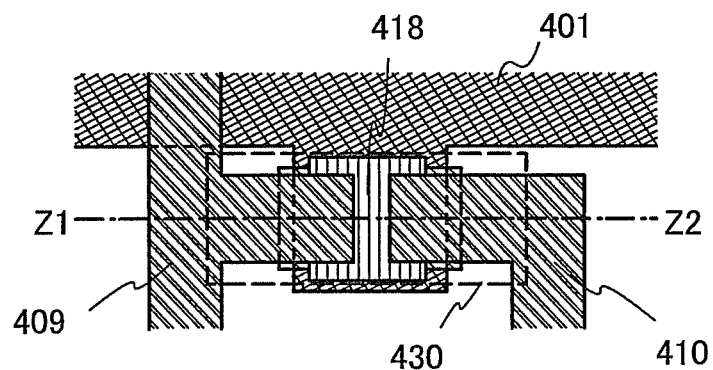

In FIG. 13A, a gate electrode 401 is provided over a substrate 400. Then, over a gate insulating layer 402 covering the gate electrode 401, a first oxide semiconductor layer 403 and a second oxide semiconductor layer 405 are provided.

In this embodiment, a Ga—Zn—O based oxide semiconductor formed by a sputtering method is used as the first oxide semiconductor layer 403, and a Sn—Zn—O based oxide semiconductor containing $SiO_x$ is used as the second oxide semiconductor layer 405. In this embodiment, an oxide semiconductor containing no indium, typically a Sn—Ga—Zn—O based oxide semiconductor, an Al—Ga—Zn—O based oxide semiconductor, a Sn—Al—Zn—O based oxide semiconductor, a Sn—Zn—O based oxide semiconductor, an Al—Zn—O based oxide semiconductor, and/or a Zn—O based oxide semiconductor are/is used as the first oxide semiconductor layer 403 and the second oxide semiconductor layer 405.

Next, a channel protective layer 418 is provided on and in contact with the second oxide semiconductor layer 405. The channel protective layer 418 is provided, whereby damage to a channel formation region of the second oxide semiconductor layer 405, which is caused in the manufacturing process (reduction in film thickness due to plasma or etchant in etching, oxidation, etc.), can be prevented. Accordingly, the reliability of the thin film transistor 430 can be improved.

The channel protective layer 418 can be formed using an inorganic material (such as silicon oxide, silicon nitride, silicon oxynitride, or silicon nitride oxide). As a manufacturing method of the channel protective layer 418, a vapor phase growth method such as a plasma CVD method or a thermal CVD method, or a sputtering method can be used. The shape of the channel protective layer 418 is processed after the film deposition. In this embodiment, a silicon oxide film is deposited by a sputtering method and processed by etching using a mask formed by photolithography, so that the channel protective layer 418 is formed.

Next, $n^+$ layers 406a and 406b are formed over the channel protective layer 418 and the second oxide semiconductor layer 405. In this embodiment, the $n^+$ layers 406a and 406b serving as a source and drain regions are Ga—Zn—O based non-single-crystal films, which are formed under deposition conditions different from the deposition conditions of the first oxide semiconductor layer 403 and the second oxide semiconductor layer 405, and are oxide semiconductor layers having lower resistance. The $n^+$ layers 406a and 406b may be formed using a Ga—Zn—O based non-single-crystal film containing nitrogen, that is, a Ga—Zn—O—N based non-single-crystal film (also called a GZON film).

Next, a first wiring 409 and a second wiring 410 are formed over the $n^+$ layer 406a and the $n^+$ layer 406b, respectively. The first wiring 409 and the second wiring 410 are each formed using an element selected from Al, Cr, Ta, Ti, Mo, and W, an alloy containing any of these elements as its component, an alloy film containing a combination of any of these elements, or the like.

By the provision of the $n^+$ layers 406a and 406b, the first wiring 409 and the second wiring 410 which are metal layers can have a good junction with the second oxide semiconductor layer 405, so that stable operation can be realized in terms of heat in comparison with a Schottky junction. In addition, it is effective that the $n^+$ layer is provided in order that carriers of a channel are supplied (on the source side), that carriers of a channel are absorbed stably (on the drain side), or that a resistive component is not produced in an interface between a wiring and an oxide semiconductor layer. Moreover, resistance is reduced, thereby ensuring high mobility even with a high drain voltage.

Figure 13C:
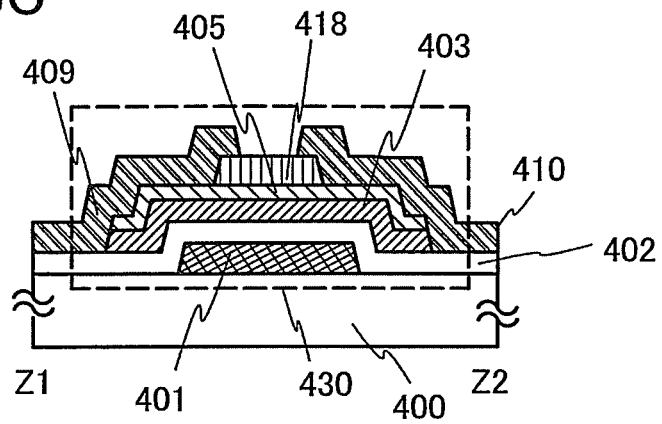

Further, the present invention is not limited to the above-described structure including the $n^+$ layers 406a and 406b; a structure in which an $n^+$ layer is not provided may be employed. An example of a cross-sectional view of a thin film transistor 191 in that case is illustrated in FIG. 13C. Note that in FIG. 13C, the structure is the same as FIG. 13A, except in that an $n^+$ layer is not provided, and therefore, the same reference numerals denote the same portions as the corresponding portions in FIG. 13A.

Next, it is preferable to perform thermal treatment at 200° C. to 600° C., typically, 300° C. to 500° C. In this embodiment, thermal treatment is performed in a furnace at 350° C. for one hour in an air atmosphere. By this thermal treatment, atomic rearrangement of the first oxide semiconductor layer 403 and the second oxide semiconductor layer 405 is performed. This thermal treatment releases strain energy which inhibits carrier travel, and therefore, the thermal treatment (including photo-annealing) is important. In addition, crystallization of the second oxide semiconductor layer 405 is inhibited by $SiO_x$ contained in the second oxide semiconductor layer 405 in the thermal treatment, whereby large part of the second oxide semiconductor layer 405 can be kept to be amorphous. There is no particular limitation on when to perform the thermal treatment as long as it is performed after the formation of the second oxide semiconductor layer 405; for example, it may be performed after the formation of a pixel electrode.

Further, indium is not used in the oxide semiconductor layer as is in this embodiment, which leads to no use of indium that might be depleted as a material.

This embodiment can be combined with the structure described in any other Embodiment, as appropriate.

For example, although the example of the stacked-layer structure in which a Ga—Zn—O based oxide semiconductor formed by a sputtering method is used as the first oxide semiconductor layer 403 and a Sn—Zn—O based oxide semiconductor containing $SiO_x$ is used as the second oxide semiconductor layer 405 is described in Embodiment 4, the present invention is not limited thereto; a single-layer structure as described in Embodiment 2 may be employed and for example, a thin film transistor using a Sn—Zn—O based oxide semiconductor containing $SiO_x$ may be manufactured.

[Embodiment 5]

In Embodiment 5, an example in which an inverter circuit is formed using two n-channel thin film transistors 760 and 761 will be described. Described in Embodiment 5 is an example in which gallium is not contained in each oxide semiconductor layer of the thin film transistors 760 and 761.

A driver circuit for driving a pixel portion is formed using an inverter circuit, a capacitor, a resistor, and the like. When two n-channel TFTs are combined to form an inverter circuit, there are two types of combinations: a combination of an enhancement type transistor and a depletion type transistor (hereinafter, a circuit formed by such a combination is referred to as an "EDMOS circuit") and a combination of enhancement type TFTs (hereinafter, a circuit formed by such a combination is referred to as an "EEMOS circuit"). Note that when the threshold voltage of the n-channel TFT is positive, the n-channel TFT is defined as an enhancement type transistor, while when the threshold voltage of the n-channel TFT is negative, the n-channel TFT is defined as a depletion type transistor; this definition is applied throughout the specification.

The pixel portion and the driver circuit are formed over the same substrate. In the pixel portion, on/off of voltage application to a pixel electrode is switched using enhancement type transistors arranged in a matrix.

Figure 14A:
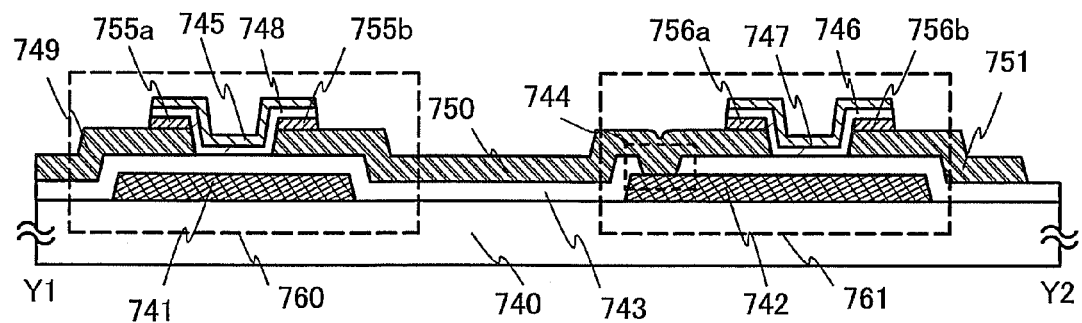
FIGS. 14A and 14B are a cross-sectional view and a top view illustrating an embodiment of the present invention.

FIG. 14A illustrates a cross-sectional structure of the inverter circuit of the driver circuit. In FIG. 14A, a first gate electrode 741 and a second gate electrode 742 are provided over a substrate 740. The first gate electrode 741 and the second gate electrode 742 each can be formed to have a single-layer or stacked-layer structure using any of a metal material such as molybdenum, titanium, chromium, tantalum, tungsten, aluminum, copper, neodymium, or scandium, and an alloy material which includes any of these materials as a main component.

Further, a first wiring 749, a second wiring 750, and a third wiring 751 are provided over a gate insulating layer 743 that covers the first gate electrode 741 and the second gate electrode 742. The second wiring 750 is directly connected to the second gate electrode 742 through a contact hole 744 formed in the gate insulating layer 743.

Further, an n$^+$ layer 755a is formed over the first wiring 749, n$^+$ layers 755b and 756a are formed over the second wiring 750, and an n$^+$ layer 756b is formed over the third wiring 751. In this embodiment, the n$^+$ layers 755a, 755b, 756a, and 756b each of which serves as a source region or a drain region are Ga—Zn—O based non-single-crystal films. The n$^+$ layers 755a, 755b, 756a, and 756b may be formed using a Ga—Zn—O based non-single-crystal film containing nitrogen, that is, a Ga—Zn—O—N based non-single-crystal film (also called a GZON film).

Further, a first oxide semiconductor layer 748 and a second oxide semiconductor layer 745 containing SiO$_x$ are provided in a position which overlaps with the first gate electrode 741 so as to interpose the n$^+$ layer 755a between the first wiring 749 and the first and second oxide semiconductor layers 748 and 745 and so as to interpose the n$^+$ layer 755b between the second wiring 750 and the first and second oxide semiconductor layers 748 and 745. Similarly, a third oxide semiconductor layer 746 and a fourth oxide semiconductor layer 747 containing SiO$_x$ are provided in a position which overlaps with the second gate electrode 742 so as to interpose the n$^+$ layer 756a between the second wiring 750 and the third and fourth oxide semiconductor layers 746 and 747 and so as to interpose the n$^+$ layer 756b between the third wiring 751 and the third and fourth oxide semiconductor layers 746 and 747.

In this embodiment, an In—Zn—O based oxide semiconductor formed by a sputtering method is used as the first oxide semiconductor layer 748 and the third oxide semiconductor layer 746. A Sn—Zn—O based oxide semiconductor containing SiO$_x$ is used as the second oxide semiconductor layer 745 and the fourth oxide semiconductor layer 747. In this embodiment, an oxide semiconductor containing no gallium, typically an In—Sn—Zn—O based oxide semiconductor, an In—Al—Zn—O based oxide semiconductor, a Sn—Al—Zn—O based oxide semiconductor, an In—Zn—O based oxide semiconductor, a Sn—Zn—O based oxide semiconductor, an Al—Zn—O based oxide semiconductor, and/or a Zn—O based oxide semiconductor are/is used as the first oxide semiconductor layer 748, the second oxide semiconductor layer 745, the third oxide semiconductor layer 746, and the fourth oxide semiconductor layer 747.

The thin film transistor 760 includes the first gate electrode 741, the first oxide semiconductor layer 748 which overlaps with the first gate electrode 741 with the gate insulating layer 743 interposed therebetween, and the second oxide semiconductor layer 745 containing SiO$_x$, and the first wiring 749 is a power supply line at a ground potential (a ground power supply line). This power supply line at a ground potential may be a power supply line to which a negative voltage VDL is applied (a negative power supply line).

In addition, the thin film transistor 761 includes the second gate electrode 742, the third oxide semiconductor layer 746 which overlaps with the second gate electrode 742 with the gate insulating layer 743 interposed therebetween, and the fourth oxide semiconductor layer 747 containing SiO$_x$, and the third wiring 751 is a power supply line to which a positive voltage VDD is applied (a positive power supply line).

As shown in FIG. 14A, the second wiring 750 which is electrically connected to both the first oxide semiconductor layer 748 and the third oxide semiconductor layer 746 is directly connected to the second gate electrode 742 of the thin film transistor 761 through a contact hole 744 formed in the gate insulating layer 743. Direct connection between the second wiring 750 and the second gate electrode 742 can provide good contact and reduce the contact resistance. In comparison with the case where the second gate electrode 742 and the second wiring 750 are connected to each other with an conductive film, e.g., a transparent conductive film, interposed therebetween, a reduction in the number of contact holes and a reduction in an area occupied by the driver circuit in accordance with the reduction in the number of contact holes can be achieved.

Figure 14B:
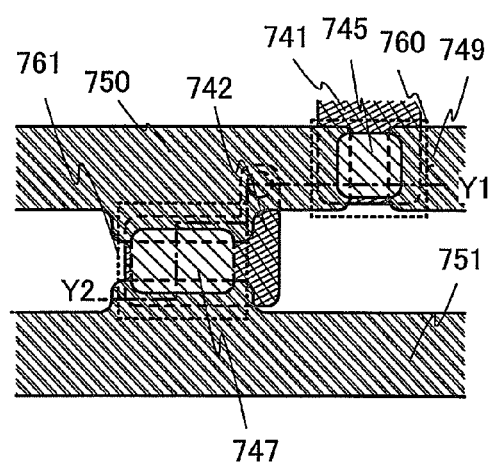

A top view of the inverter circuit of the driver circuit is illustrated in FIG. 14B. A cross section taken along dotted-line Y1-Y2 in FIG. 14B corresponds to FIG. 14A.

Figure 15A:
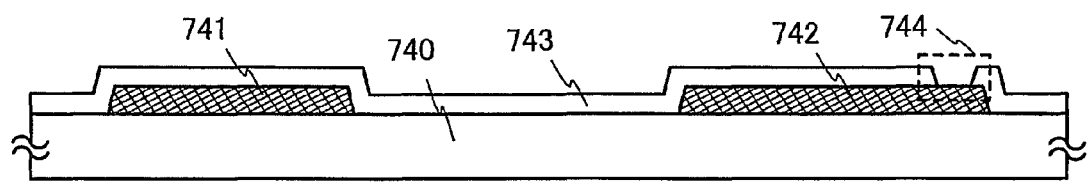
FIGS. 15A to 15C are cross-sectional views illustrating manufacturing steps of an embodiment of the present invention.
Figure 15B:
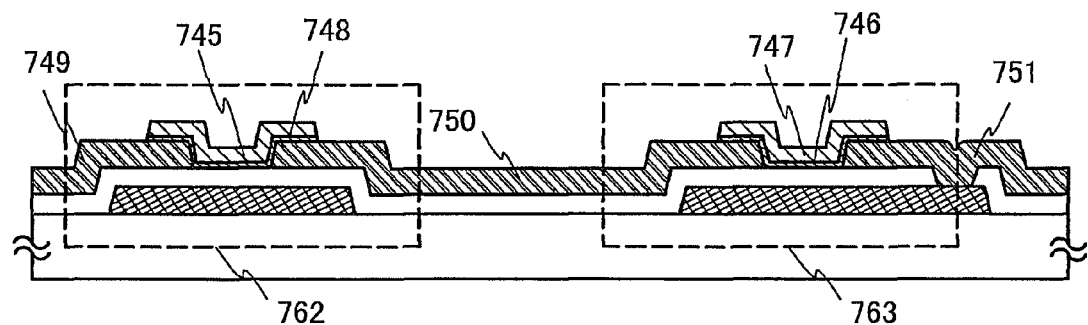
Figure 15C:
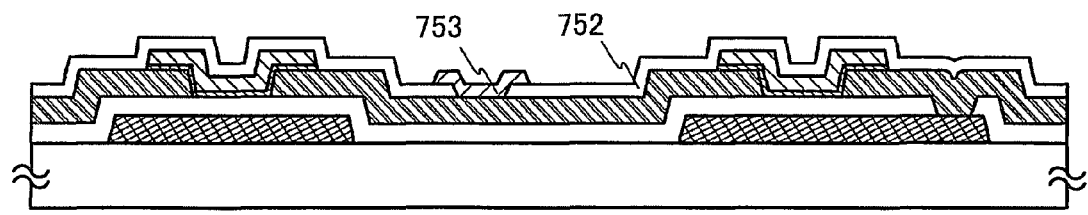

Further, an example of a manufacturing process of an inverter circuit using thin film transistors 762 and 763 each of which does not include an n$^+$ layer is illustrated in FIGS. 15A to 15C.

A first conductive film is formed over a substrate 740 by a sputtering method and is selectively etched using a first photomask to form a first gate electrode 741 and a second gate electrode 742. Next, a gate insulating layer 743 for covering the first gate electrode 741 and the second gate electrode 742 is formed by a plasma CVD method or a sputtering method. The gate insulating layer 743 can be formed to have a single-layer or a stacked-layer structure using any of a silicon oxide layer, a silicon nitride layer, a silicon oxynitride layer, and a silicon nitride oxide layer by a CVD method, a sputtering method, or the like. The gate insulating layer 743 can be formed using a silicon oxide layer by a CVD method using an organosilane gas.

Next, the gate insulating layer 743 is selectively etched using a second photomask to form a contact hole 744 which reaches the second gate electrode 742. A cross-sectional view at this stage corresponds to FIG. 15A.

Next, a second conductive film is deposited by a sputtering method and is selectively etched using a third photomask to form a first wiring 749, a second wiring 750, and a third wiring 751. The third wiring 751 is directly in contact with the second gate electrode 742 through the contact hole 744.

Next, a first oxide semiconductor film and a second oxide semiconductor film containing $SiO_x$ are deposited to be stacked by a sputtering method. It is preferable that, before the deposition of the first oxide semiconductor film by a sputtering method, dust attached to a surface of the gate insulating layer 743 and a bottom surface of the contact hole 744 is removed by reverse sputtering in which an argon gas is introduced and plasma is generated. Reverse sputtering refers to a method in which, without application of a voltage to a target side, an RF power source is used for application of a voltage to a substrate side in an argon atmosphere to change the quality of a surface. Note that instead of an argon atmosphere, nitrogen, helium, or the like may be used. An argon atmosphere to which oxygen, hydrogen, $N_2O$, or the like is added may be used as well. Further, an argon atmosphere to which $Cl_2$, $CF_4$, or the like is added may be used as well.

Next, the first oxide semiconductor film and the second oxide semiconductor film containing $SiO_x$ are selectively etched using a fourth photomask. By this etching, a stack of a first oxide semiconductor layer 748 and a second oxide semiconductor layer 745 containing $SiO_x$ is formed over the first gate electrode 741, and a stack of a third oxide semiconductor layer 746 and a fourth oxide semiconductor layer 747 containing $SiO_x$ is formed over the second gate electrode 742.

Next, a protective layer 752 is formed and is selectively etched using a fifth photomask to form a contact hole. After that, a third conductive film is formed. Finally, the third conductive film is selectively etched using a sixth photomask to form a connection wiring 753 which is electrically connected to the second wiring 750. A cross-sectional view at this stage corresponds to FIG. 15C.

The protective layer 752 can be formed using an inorganic material (such as silicon oxide, silicon nitride, silicon oxynitride, or silicon nitride oxide). The protective layer 752 can be formed by a vapor phase growth method such as a plasma CVD method or a thermal CVD method, or a sputtering method.

Next, it is preferable to perform thermal treatment at 200° C. to 600° C., typically, 300° C. to 500° C. In this embodiment, thermal treatment is performed in a furnace at 350° C. for one hour in an air atmosphere. By this thermal treatment, atomic rearrangement of the first oxide semiconductor layer 748, the second oxide semiconductor layer 745, the third oxide semiconductor layer 746, and the fourth oxide semiconductor layer 747 is performed. This thermal treatment releases strain energy which inhibits carrier travel, and therefore, the thermal treatment (including photo-annealing) is important. There is no particular limitation on when to perform the thermal treatment as long as it is performed after the formation of the second oxide semiconductor layer 745; for example, it may be performed after the formation of a pixel electrode.

Further, gallium is not used in the oxide semiconductor layer as is in this embodiment, so that a target containing gallium that is a material which brings high manufacturing cost is not necessarily used.

This embodiment can be combined with the structure described in any other Embodiment, as appropriate.

For example, although the example of the stacked-layer structure in which an In—Zn—O based oxide semiconductor formed by a sputtering method is used as each of the first oxide semiconductor layer 748 and the third oxide semiconductor layer 746 and a Sn—Zn—O based oxide semiconductor containing $SiO_x$ is used as each of the second oxide semiconductor layer 745 and the fourth oxide semiconductor layer 747 is described in Embodiment 5, the present invention is not limited thereto; a single-layer structure as described in Embodiment 2 may be employed and for example, a thin film transistor using a Sn—Zn—O based oxide semiconductor containing $SiO_x$ may be manufactured.

[Embodiment 6]

In Embodiment 6, an example of a top-gate type thin film transistor 330 will be described using FIGS. 16A and 16B. FIG. 16B is an example of a top view of a thin film transistor, cross-sectional view along dotted line P1-P2 of which corresponds to FIG. 16A.

Figure 16A:
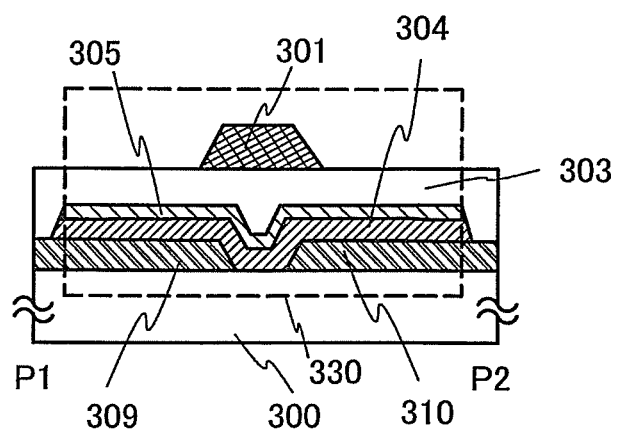
FIGS. 16A and 16B are a cross-sectional view and a top view illustrating an embodiment of the present invention.
Figure 16B:
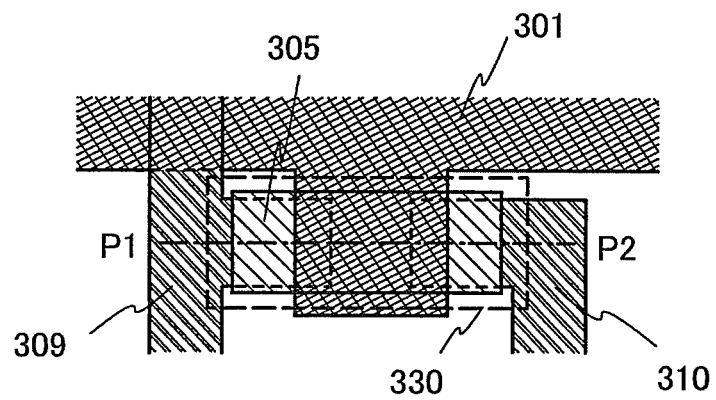

In FIG. 16A, a first wiring 309 and a second wiring 310 are formed over a substrate 300. The first wiring 309 and the second wiring 310 serve as a source and drain electrodes.

Next, a first oxide semiconductor layer 304 containing $SiO_x$ and a second oxide semiconductor layer 305 are formed over the first wiring 309 and the second wiring 310. In this embodiment, a Sn—Zn—O based oxide semiconductor containing $SiO_x$ is used as the first oxide semiconductor layer 304, and an In—Ga—Zn—O based non-single-crystal film is used as the second oxide semiconductor layer 305.

In the first oxide semiconductor layer 304, an oxide semiconductor layer having a concentration gradient of a Si element in the film thickness direction, increasing in accordance with an increase in the distance from a gate electrode formed later may be included.

Next, a gate insulating layer 303 which covers the second oxide semiconductor layer 305, the first wiring 309, and the second wiring 310 is formed.

Next, it is preferable to perform thermal treatment at 200° C. to 600° C., typically, 300° C. to 500° C. In this embodiment, thermal treatment is performed in a furnace at 350° C. for one hour in an air atmosphere. By this thermal treatment, atomic rearrangement of the first oxide semiconductor layer 304 and the second oxide semiconductor layer 305 is performed. This thermal treatment releases strain energy which inhibits carrier travel, and therefore, the thermal treatment (including photo-annealing) is important.

Next, a gate electrode 301 is provided in a position which overlaps with the region where the first oxide semiconductor layer 304 is in contact with the substrate 300, over the gate insulating layer 303.

Through the above process, the top-gate type thin film transistor 330 can be manufactured.

This embodiment can be combined with the structure described in any other Embodiment, as appropriate.

For example, although the example of the stacked-layer structure in which a Sn—Zn—O based oxide semiconductor containing $SiO_x$ formed by a sputtering method is used as the first oxide semiconductor layer 304 and an In—Ga—Zn—O based oxide semiconductor is used as the second oxide semiconductor layer 305 is described in Embodiment 6, the present invention is not limited thereto; a single-layer structure may be employed and for example, a thin film transistor using a Sn—Zn—O based oxide semiconductor containing $SiO_x$ may be manufactured.

[Embodiment 7]

In Embodiment 7, an example of a top-gate type thin film transistor 630 will be described using FIGS. 17A and 17B. FIG. 17B is an example of a top view of a thin film transistor, cross-sectional view along dotted line R1-R2 of which corresponds to FIG. 17A.

Figure 17A:
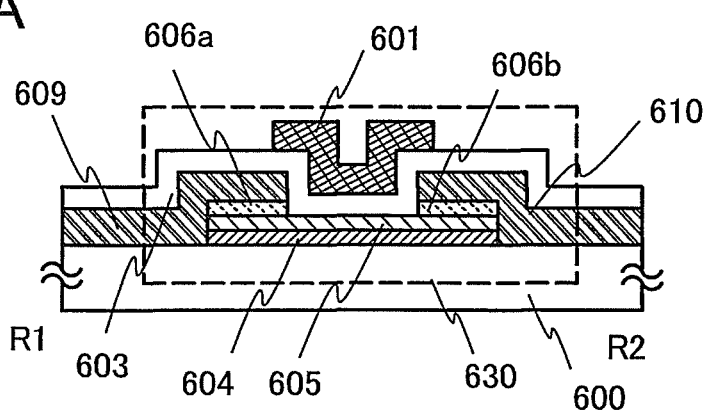
FIGS. 17A and 17B are a cross-sectional view and a top view illustrating an embodiment of the present invention.
Figure 17B:
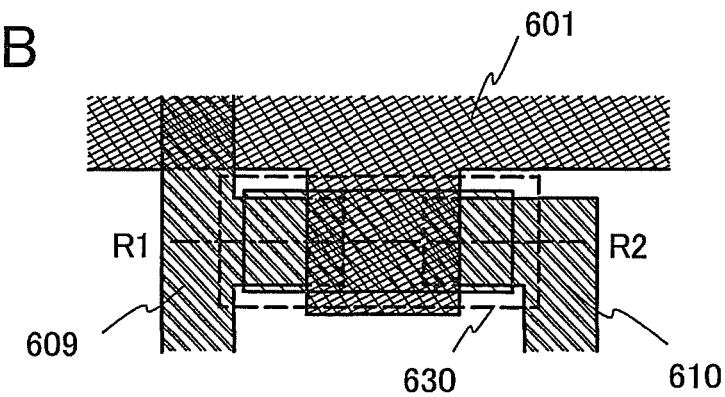

In FIG. 17A, a first oxide semiconductor layer 604 containing $SiO_x$ and a second oxide semiconductor layer 605 are formed over a substrate 600. In this embodiment, a Sn—Zn—O based oxide semiconductor film containing $SiO_x$ is used as the first oxide semiconductor layer 604, and an In—Ga—Zn—O based non-single-crystal film is used as the second oxide semiconductor layer 605.

In the first oxide semiconductor layer 604, an oxide semiconductor layer having a concentration gradient of a Si element in the film thickness direction, increasing in accordance with an increase in the distance from a gate electrode formed later may be included.

Next, $n^+$ layers 606a and 606b are formed over the second oxide semiconductor layer 605. In this embodiment, the $n^+$ layers 606a and 606b which serve as a source and drain regions are Ga—Zn—O based non-single-crystal films. The $n^+$ layers 606a and 606b may be formed using a Ga—Zn—O based non-single-crystal film containing nitrogen, that is, a Ga—Zn—O—N based non-single-crystal film (also called a GZON film).

Next, a first wiring 609 is formed over the $n^+$ layer 606a and a second wiring 610 is formed over the $n^+$ layer 606b. The first wiring 609 and the second wiring 610 serve as a source and drain electrodes.

Next, a gate insulating layer 603 is formed over the first wiring 609 and the second wiring 610.

Next, a gate electrode 601 is provided in a position which overlaps with the region where the second oxide semiconductor layer 605 is in contact with the gate insulating layer 603, over the gate insulating layer 603.

Next, it is preferable to perform thermal treatment at 200° C. to 600° C., typically, 300° C. to 500° C. In this embodiment, thermal treatment is performed in a furnace at 350° C. for one hour in an air atmosphere. By this thermal treatment, atomic rearrangement of the first oxide semiconductor layer 604 and the second oxide semiconductor layer 605 is performed. This thermal treatment releases strain energy which inhibits carrier travel, and therefore, the thermal treatment (including photo-annealing) is important.

Through the above process, the top-gate type thin film transistor 630 can be manufactured.

Further, the present invention is not limited to the above-described structure including the $n^+$ layers 606a and 606b; a structure in which an $n^+$ layer is not provided may be employed.

This embodiment can be combined with the structure described in any other Embodiment, as appropriate.

For example, although the example of the stacked-layer structure in which a Sn—Zn—O based oxide semiconductor containing $SiO_x$ formed by a sputtering method is used as the first oxide semiconductor layer 604 and an In—Ga—Zn—O based oxide semiconductor is used as the second oxide semiconductor layer 605 is described in Embodiment 7, the present invention is not limited thereto; a single-layer structure may be employed and for example, a thin film transistor using a Sn—Zn—O based oxide semiconductor containing $SiO_x$ may be manufactured.

[Embodiment 8]

In Embodiment 8, an example of a light-emitting display device will be described as a semiconductor device. As a display element included in a display device, a light-emitting element using electro luminescence is described here. Light-emitting elements using electroluminescence are classified according to whether a light-emitting material is an organic compound or an inorganic compound; the former is referred to as an organic EL element, and the latter as an inorganic EL element.

In an organic EL element, voltage is applied to the light-emitting element, so that electrons are injected from one electrode into a layer including a light-emitting organic compound, and holes are injected from the other electrode into the layer including a light-emitting organic compound, whereby current flows. Then, by recombination of these carriers (electrons and holes), the light-emitting organic compound gets in an excited state, and light is emitted when the excited state returns to a ground state. From such a mechanism, such a light-emitting element is called a current excitation type light-emitting element.

Inorganic EL elements are classified in a dispersive inorganic EL element and a thin-film inorganic EL element. A dispersive inorganic EL element includes a light-emitting layer in which particles of a light-emitting material are dispersed in a binder, and light emission mechanism thereof is donor-acceptor recombination light emission in which a donor level and an acceptor level are utilized. In a thin-film inorganic EL element, a light-emitting layer is sandwiched between dielectric layers, and the dielectric layers are sandwiched between electrodes. Light emission mechanism thereof is local light emission in which inner-shell electron transition of a metal ion is utilized. Described here is the case in which an organic EL element is used as a light-emitting element.

Figure 18:
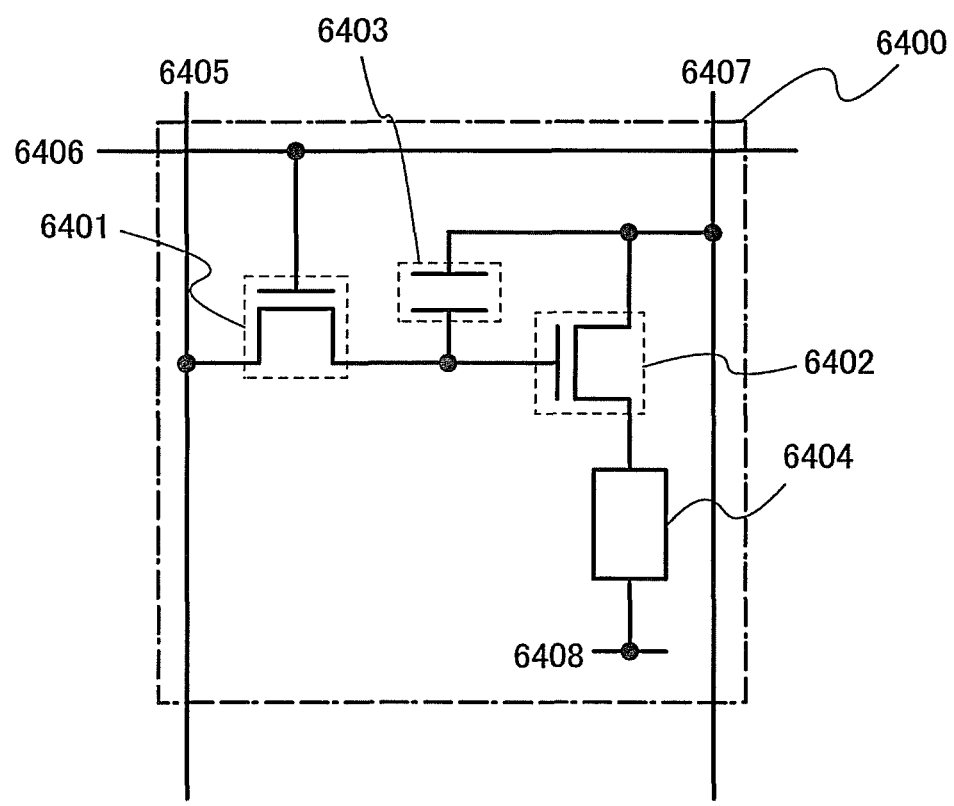
FIG. 18 is a diagram illustrating a pixel circuit.

FIG. 18 is a diagram showing an example of a pixel configuration as an example of a semiconductor device, which can be driven by a digital time grayscale method.

The configuration and operation of the pixel to which a digital time grayscale method can be applied are described. Described here is an example in which two n-channel transistors using an oxide semiconductor layer (typically, an In—Ga—Zn—O based non-single-crystal film containing $SiO_x$) in a channel formation region are provided in each pixel.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408. The common electrode 6408 is electrically connected to a common potential line, the common electrode 6408 and the common potential line are formed over the same substrate, and a portion in which the common electrode 6408 is electrically connected to the common potential line may be used as a common connection portion.

The second electrode of the light-emitting element 6404 (the common electrode 6408) is set to a low power supply potential. The low power supply potential is a potential satisfying the low power supply potential<a high power supply potential with the high power supply potential set to the power supply line 6407 as a reference. A potential difference between the high power supply potential and the low power supply potential is applied to the light-emitting element 6404, so that current flows into the light-emitting element 6404. In order to make the light-emitting element 6404 emit light, each potential is set so that the potential difference between the high power supply potential and the low power supply potential is equal to or greater than the forward threshold voltage of the light-emitting element 6404.

Gate capacitance of the driving transistor 6402 may be used as a substitute for the capacitor 6403, so that the capacitor 6403 can be omitted. The gate capacitance of the driving transistor 6402 may be formed between the channel region and the gate electrode of the driving transistor 6402.

In the case of a voltage-input voltage-driving method, a video signal is input to the gate of the driving transistor 6402 so that the driving transistor 6402 is in either of two states of being sufficiently turned on and turned off. That is, the driving transistor 6402 operates in a linear region. Since the driving transistor 6402 operates in a linear region, a voltage higher than the voltage of the power supply line 6407 is applied to the gate of the driving transistor 6402. A voltage greater than or equal to (power supply line voltage+$V_{th}$ of the driving transistor 6402) is applied to the signal line 6405.

In the case of performing analog grayscale driving instead of digital time grayscale driving, the same pixel configuration as FIG. 18 can be used by changing signal input.

In the case of performing the analog grayscale driving, a voltage greater than or equal to (forward voltage of the light-emitting element 6404+$V_{th}$ of the driving transistor 6402) is applied to the gate of the driving transistor 6402. The forward voltage of the light-emitting element 6404 refers to a voltage with which a desired luminance is obtained, and includes at least a forward threshold voltage. The video signal at which the driving transistor 6402 operates in a saturation region is input, so that current can flow into the light-emitting element 6404. In order that the driving transistor 6402 can operate in the saturation region, the potential of the power supply line 6407 is set to be higher than the gate potential of the driving transistor 6402. By using an analog signal as the video signal, current in accordance with the video signal flows into the light-emitting element 6404, so that the analog grayscale driving can be performed.

Note that the pixel configuration shown in FIG. 18 is not limited to the above-described configuration. For example, a switch, a resistor, a capacitor, a transistor, a logic circuit, or the like may be added to the pixel shown in FIG. 18.

Figure 19A:
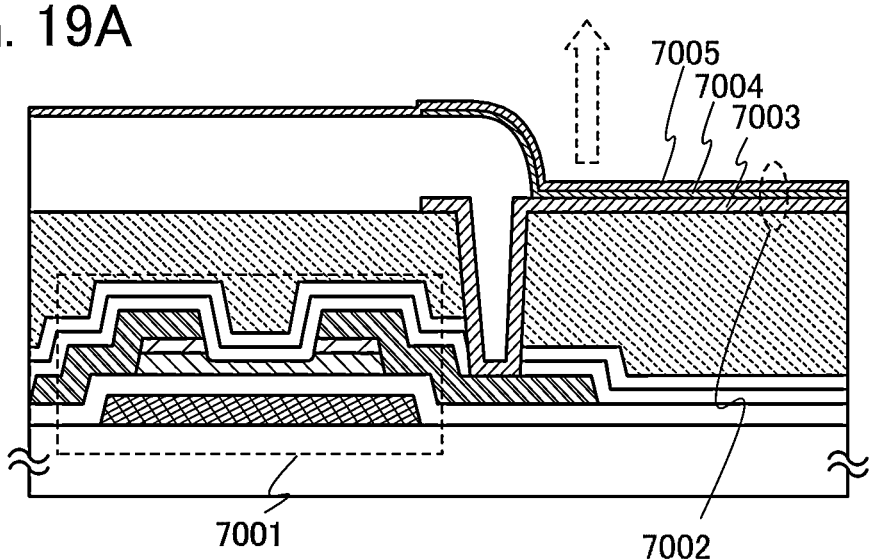
FIGS. 19A to 19C are cross-sectional views each illustrating an embodiment of the present invention.
Figure 19B:
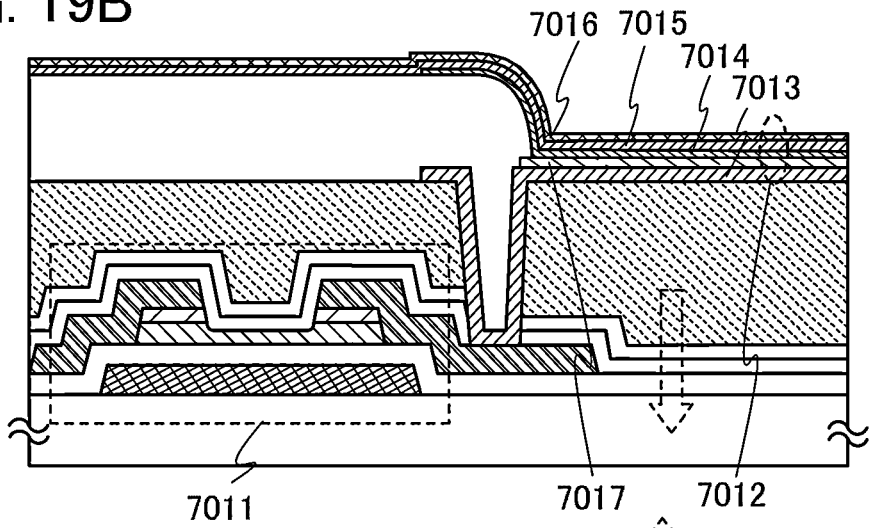
Figure 19C:
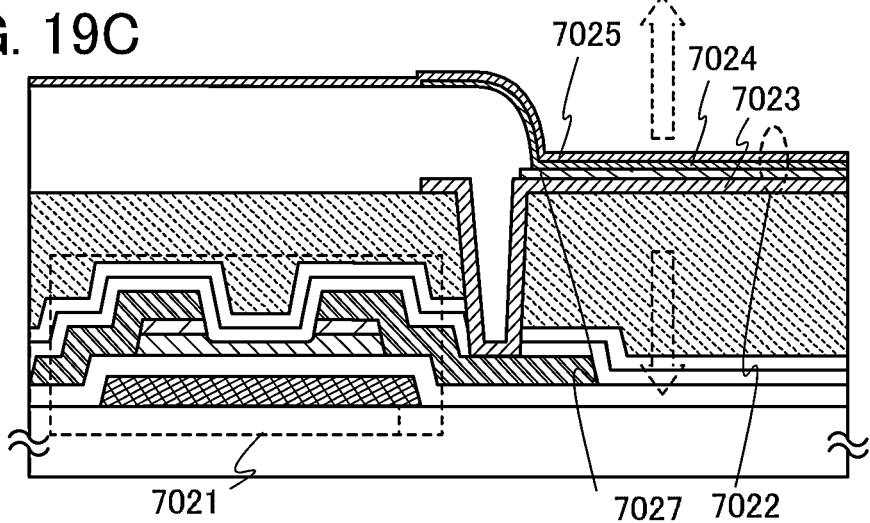

Next, structures of light-emitting elements are described using FIGS. 19A to 19C. A cross-sectional structure of a pixel in the case where an n-channel driving TFT is used is described. TFTs 7001, 7011, and 7021 serving as driver TFTs used for respective semiconductor devices illustrated in FIGS. 19A, 19B, and 19C, can be manufactured in a manner similar to the second thin film transistor 170 described in Embodiment 2. The TFTs 7001, 7011, and 7021 are thin film transistors each including an oxide semiconductor film containing $SiO_x$.

In order to extract light emission of the light-emitting element, at least one of an anode and a cathode may be transparent. A thin film transistor and a light-emitting element are formed over a substrate. A light-emitting element can have: a top emission structure in which light emission is extracted through the surface on the opposite side to the substrate; a bottom emission structure in which light emission is extracted through the surface on the substrate side; or a dual emission structure in which light emission is extracted through the surface on the substrate side and the surface on the opposite side to the substrate. The pixel configuration can be applied to a light-emitting element having any of these emission structures.

A light-emitting element having a top emission structure is described using FIG. 19A.

FIG. 19A is a cross-sectional view of a pixel in the case where the driving TFT 7001 is an n-channel TFT and light is emitted from a light-emitting element 7002 and passes through an anode 7005 side. In the TFT 7001, an In—Sn—Zn—O based oxide semiconductor containing silicon oxide is used as a semiconductor layer. The impurity such as silicon oxide contained can prevent crystallization of the oxide semiconductor and/or generation of a microcrystal grain even when thermal treatment at 300° C. to 600° C. is performed. In FIG. 19A, a cathode 7003 of the light-emitting element 7002 is electrically connected to the driving TFT 7001, and a light-emitting layer 7004 and the anode 7005 are stacked in this order over the cathode 7003. The cathode 7003 can be formed using a variety of materials as long as they are conductive films which have low work functions and reflect light. For example, Ca, Al, MgAg, AlLi, or the like is preferably used. The light-emitting layer 7004 may be formed using either a single layer or a stacked layer of a plurality of layers. If the light-emitting layer 7004 is formed using a plurality of layers, an electron-injecting layer, an electron-transporting layer, a light-emitting layer, a hole-transporting layer, and a hole-injecting layer are stacked in this order over the cathode 7003. It is not necessary to provide all of these layers. The anode 7005 is formed using a light-transmitting conductive material such as indium oxide including tungsten oxide, indium zinc oxide including tungsten oxide, indium oxide including titanium oxide, indium tin oxide including titanium oxide, indium tin oxide (hereinafter, referred to as ITO), indium zinc oxide, or indium tin oxide to which silicon oxide is added.

A region where the light-emitting layer 7004 is sandwiched between the cathode 7003 and the anode 7005 corresponds to the light-emitting element 7002. In the case of the pixel illustrated in FIG. 19A, light is emitted from the light-emitting element 7002 and passes through the anode 7005 side as indicated by an arrow.

Next, a light-emitting element having a bottom emission structure is described using FIG. 19B. FIG. 19B is a cross-sectional view of a pixel in the case where a driving TFT 7011 is an n-channel TFT and light emitted from a light-emitting element 7012 passes through a cathode 7013 side. In the TFT 7011, an In—Al—Zn—O based oxide semiconductor containing silicon oxide is used as a semiconductor layer. The impurity such as silicon oxide contained can prevent crystallization of the oxide semiconductor and/or generation of a microcrystal grain even when thermal treatment at 300° C. to 600° C. is performed. In FIG. 19B, the cathode 7013 of the light-emitting element 7012 is formed over a light-transmitting conductive film 7017 that is electrically connected to the driving TFT 7011, and a light-emitting layer 7014 and an anode 7015 are stacked in this order over the cathode 7013. A blocking film 7016 for reflecting or blocking light may be formed so as to cover the anode 7015 when the anode 7015 has a light-transmitting property. As the cathode 7013, a variety of materials can be used as is in the case of FIG. 19A as long as they are conductive materials having low work functions. The cathode 7013 has a thickness as small as light can be transmitted therethrough (preferably, about 5 to 30 nm). For example, an aluminum film with a thickness of 20 nm can be used as the cathode 7013. Further, as is in FIG. 19A, the light-emitting layer 7014 may be formed using a single layer or a stacked layer including a plurality of layers. Although the anode 7015 does not need to transmit light, the anode 7015 can be formed using a light-transmitting conductive material as is in FIG. 19A. As for the blocking film 7016, a metal or the like that reflects light can be used; however, it is not limited to a metal film. For example, a resin or the like to which black pigments are added can be used.

A region where the light-emitting layer 7014 is sandwiched between the cathode 7013 and the anode 7015 corresponds to the light-emitting element 7012. In the case of the pixel illustrated in FIG. 19B, light is emitted from the light-emitting element 7012 and ejected to the cathode 7013 side as indicated by an arrow.

Next, a light-emitting element having a dual emission structure is described using FIG. 19C. In FIG. 19C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. In the TFT 7021, a Sn—Al—Zn—O based oxide semiconductor containing silicon oxide is used as a semiconductor layer. The impurity such as silicon oxide contained can prevent crystallization of the oxide semiconductor and/or generation of a microcrystal grain even when thermal treatment at 300° C. to 600° C. is performed. As in the case of FIG. 19A, the cathode 7023 can be formed using a variety of conductive materials as long as they have low work functions. The cathode 7023 has a thickness as small as light can be transmitted therethrough. For example, an aluminum film with a thickness of 20 nm can be used as the cathode 7023. Further, as is in FIG. 19A, the light-emitting layer 7024 may be formed using a single layer or a stacked layer including a plurality of layers. As is in FIG. 19A, the anode 7025 can be formed using a light-transmitting conductive material.

A region where the cathode 7023, the light-emitting layer 7024, and the anode 7025 overlap with each other corresponds to the light-emitting element 7022. In the case of the pixel illustrated in FIG. 19C, light is emitted from the light-emitting element 7022 and ejected to both the anode 7025 side and the cathode 7023 side as indicated by arrows.

Although an organic EL element is described as a light-emitting element in Embodiment 8, it is also possible to provide an inorganic EL element as a light-emitting element.

An example in which a thin film transistor for controlling the driving of a light-emitting element (a driving TFT) is electrically connected to a light-emitting element is described in Embodiment 8; a current control TFT may be provided between the driving TFT and the light-emitting element.

Through the above step, a highly reliable light-emitting display device (display panel) as a semiconductor device can be manufactured.

This embodiment can be combined with the structure described in any other Embodiment, as appropriate.

[Embodiment 9]

In Embodiment 9, an example of electronic paper will be described as a semiconductor device.

Figure 20A:
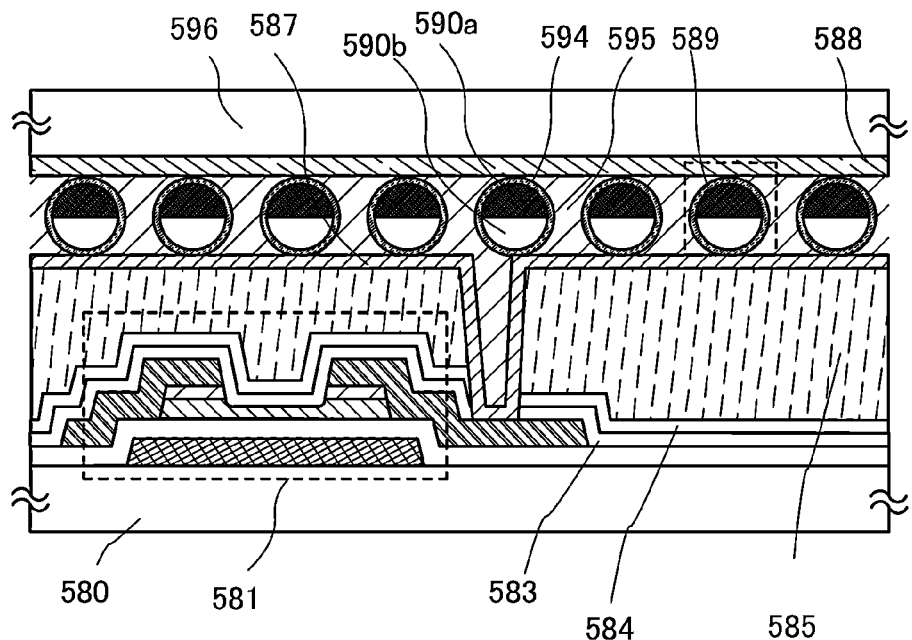
FIGS. 20A and 20B are a cross-sectional view and an external view illustrating an embodiment of the present invention.

FIG. 20A is a cross-sectional view illustrating an active-matrix electronic paper. A thin film transistor 581 used in a display portion of the semiconductor device can be manufactured in a manner similar to the thin film transistor 170 described in Embodiment 2 and is a thin film transistor having highly electrical characteristics, including an oxide semiconductor film as a semiconductor layer. In this embodiment, a thin film transistor having highly electrical characteristics, in which a Zn—O based oxide semiconductor containing silicon oxide is included as a semiconductor layer is used.

The electronic paper in FIG. 20A is an example of a display device using a twisting ball display system. According to a twisting ball display system, the direction of spherical particles each of which is colored separately in black and white, which are arranged between a first electrode layer and a second electrode layer which are electrode layers used for a display element is controlled by a potential difference generated between the first electrode layer and the second electrode layer to display an image.

The thin film transistor 581 interposed between a substrate 580 and a substrate 596 is a bottom-gate thin film transistor, and a source or drain electrode layer thereof is in contact with a first electrode layer 587 through an opening formed in insulating layers 583, 584, and 585, whereby the thin film transistor 581 is electrically connected to the first electrode layer 587. Between the first electrode layer 587 and a second electrode layer 588, spherical particles 589 are provided. Each spherical particle 589 includes a black region 590a and a white region 590b, and a cavity 594 filled with liquid around the black region 590a and the white region 590b. The space between the spherical particles 589 is filled with a filler 595 such as a resin (see FIG. 20A).

In Embodiment 9, the first electrode layer 587 corresponds to a pixel electrode and the second electrode layer 588 corresponds to a common electrode. The second electrode layer 588 is electrically connected to a common potential line, the common potential line and the thin film transistor 581 are provided over the same substrate. The second electrode layer 588 and the common potential line are electrically connected through conductive particles arranged between a pair of substrates, in the common connection portion.

Instead of the twisting ball, an electrophoretic element can also be used. A microcapsule having a diameter of about 10 μm to 200 μm, in which transparent liquid and positively charged white microparticles and negatively charged black microparticles are encapsulated, is used. In the microcapsule that is provided between the first electrode layer and the second electrode layer, when an electric field is applied by the first electrode layer and the second electrode layer, the white microparticles and the black microparticles migrate to opposite sides to each other, so that color white or black can be displayed. A display element using this principle is an electrophoretic display element and is called electronic paper. The electrophoretic display element has higher reflectivity than a liquid crystal display element; thus, an auxiliary light is not required, power consumption is small, and a display portion can be recognized even in a dusky place. In addition, even when power is not supplied to the display portion, an image which has been displayed once can be maintained; thus, a displayed image can be stored even if a semiconductor device equipped with a display function (which may simply be referred to as a display device or a semiconductor device provided with a display device) is distanced from an electric wave source.

By manufacturing the thin film transistor according to the process described in Embodiment 2, electronic paper can be manufactured with reduced manufacturing cost, as a semiconductor device. An electronic paper can be used for electronic apparatuses of a variety of fields as long as they can display data. For example, an electronic paper can be applied to an e-book reader (electronic book), a poster, an advertisement in a vehicle such as a train, or displays of various cards such as a credit card. An example of the electronic apparatus is illustrated in FIG. 20B.

Figure 20B:
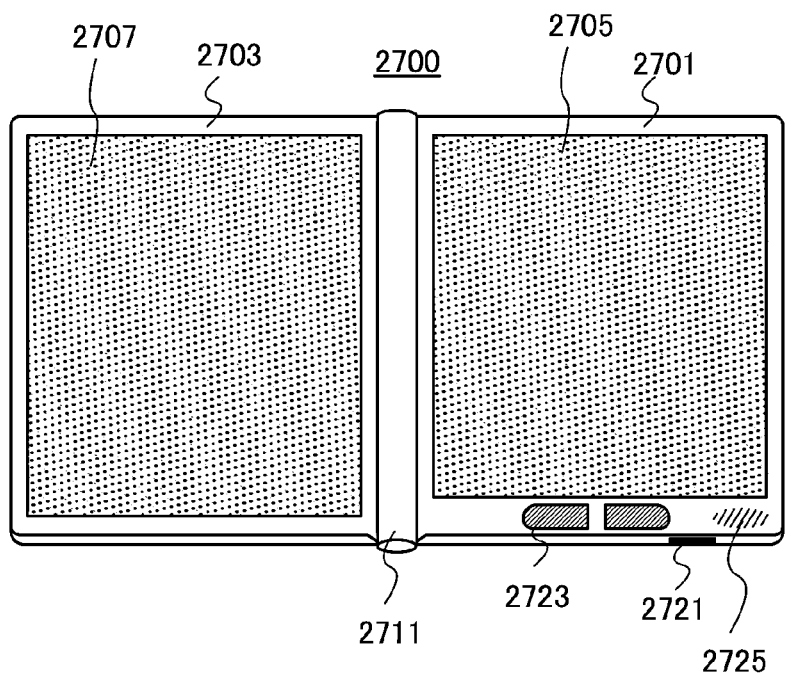

FIG. 20B illustrates an example of an e-book reader 2700. For example, the e-book reader 2700 includes two housings: a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20B) can display text whereas a display portion on the left side (the display portion 2707 in FIG. 20B) can display graphics.

In the example illustrated in FIG. 20B, the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, and the like may be provided on the same plane as the display portion of the housing. Further, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may be equipped with a function of an electronic dictionary.

The e-book reader 2700 may have a structure capable of wirelessly transmitting and receiving data. Through wireless communication, book data or the like can be purchased and downloaded from an e-book server.

This embodiment can be combined with the structure described in any other Embodiment, as appropriate.

[Embodiment 10]

A semiconductor device including a thin film transistor using an oxide semiconductor layer can be applied to a variety of electronic apparatuses (including amusement machines). Examples of electronic appliances include television sets (also referred to as televisions or television receivers), monitors of computers or the like, cameras such as digital cameras or digital video cameras, digital photo frames, cellular phones (also referred to as mobile phones or mobile phone sets), portable game consoles, portable information terminals, audio reproducing devices, and large-sized game machines such as pachinko machines.

Figure 21A:
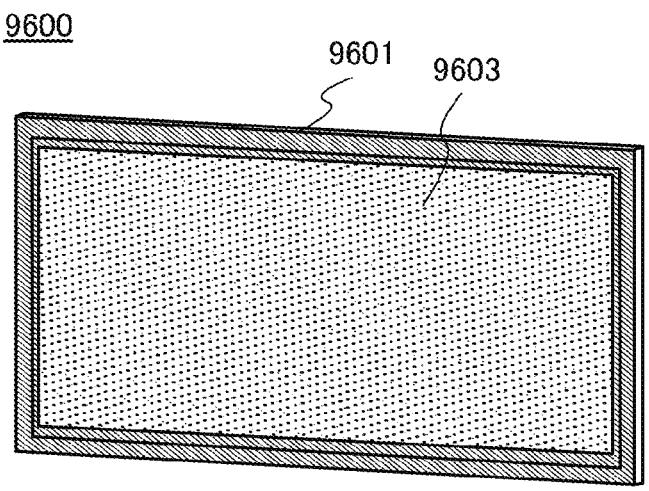
FIGS. 21A and 21B are external views each illustrating an embodiment of the present invention.
Figure 21A:
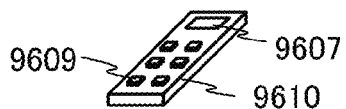

FIG. 21A illustrates an example of a television set 9601. In the television set 9601, a display portion 9603 is incorporated in a housing. The display portion 9603 can display images. Illustrated in FIG. 21A is the structure in which the rear side of the housing is supported by fixing to a wall 9600.

The television set 9601 can be operated with an operation switch provided with the housing or a separate remote controller 9610. Channels and volume can be controlled with an operation key 9609 provided with the remote controller 9610 so that an image displayed on the display portion 9603 can be controlled. Furthermore, the remote controller 9610 may be provided with a display portion 9607 for displaying data output from the remote controller 9610.

Note that the television set 9601 is provided with a receiver, a modem, and the like. With the receiver, general television broadcasting can be received. Moreover, when the display device is connected to a communication network with or without wires via the modem, one-way (from sender to receiver) or two-way (between sender and receiver or between receivers) data communication can be performed.

Figure 21B:
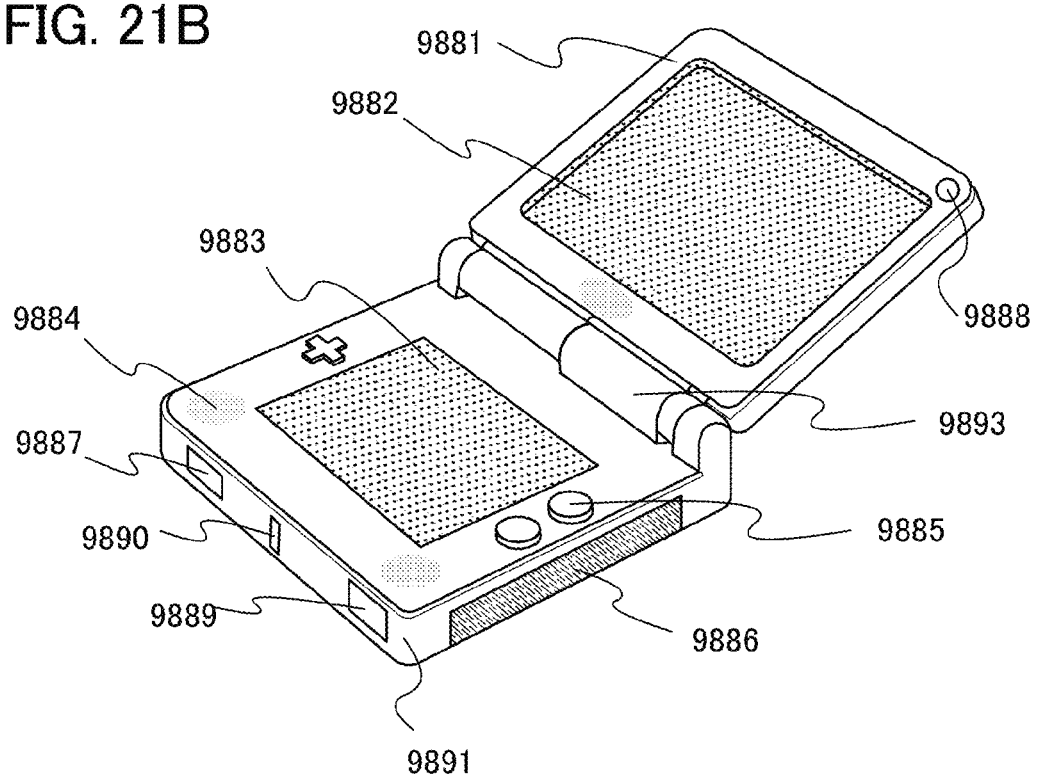

FIG. 21B is a portable amusement machine including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. In addition, the portable amusement machine illustrated in FIG. 21B includes a speaker portion 9884, a recording medium insertion portion 9886, an LED lamp 9890, an input unit (operation keys 9885, a connection terminal 9887, a sensor 9888 (a sensor equipped with a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. The structure of the portable amusement machine is not limited to the above as long as a semiconductor device is provided; any other structure provided with any other accessory equipment as appropriate can be employed as well. The portable amusement machine illustrated in FIG. 21B is equipped with a function of reading a program or data stored in a recording medium to display on the display portion and/or a function of sharing data with another portable amusement machine by wireless communication. The portable amusement machine illustrated in FIG. 21B can be equipped with various functions without being limited to the above.

Figure 22A:
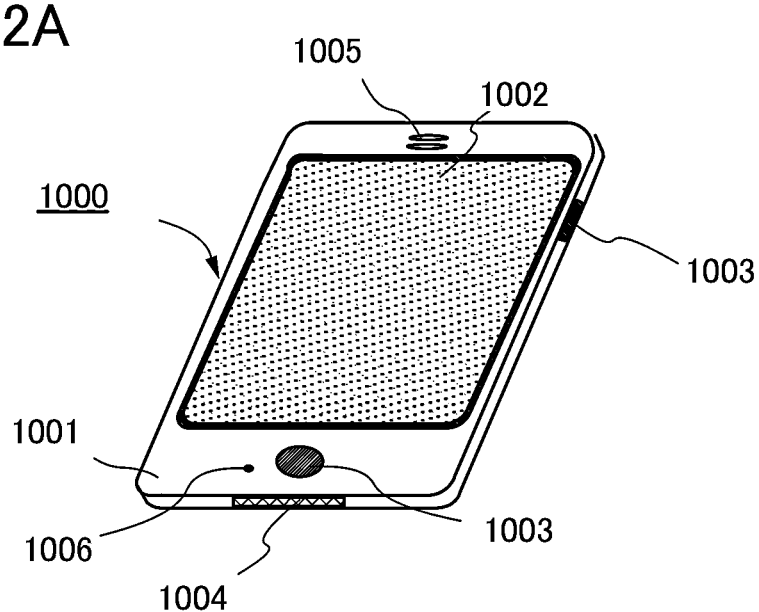
FIGS. 22A and 22B are external views each illustrating an embodiment of the present invention.

FIG. 22A illustrates an example of a mobile phone 1000. The mobile phone 1000 is provided with a display portion 1002 incorporated in a housing 1001, operation buttons 1003, an external connection port 1004, a speaker 1005, a microphone 1006, and the like.

Data can be input to the mobile phone 1000 illustrated in FIG. 22A by touching the display portion 1002 with a finger or the like. Furthermore, operations such as making calls and texting messaging can be performed by touching the display portion 1002 with a finger or the like.

There are mainly three screen modes of the display portion 1002. The first is a display mode mainly for displaying an image. The second is an input mode mainly for inputting data such as text. The third is a display-and-input mode in which two modes of the display mode and the input mode are mixed.

For example, in the case of making a call or texting messaging, the text input mode mainly for inputting text is selected for the display portion 1002 so that text displayed on the screen can be input. In that case, it is preferable to display a keyboard or number buttons on almost all the area of the screen of the display portion 1002.

Further, a detector including a sensor for detecting inclination, such as a gyroscope or an acceleration sensor, may be provided inside the mobile phone 1000, so that display on the screen of the display portion 1002 can be automatically switched by determining the direction of the mobile phone 1000 (whether the mobile phone 1000 is placed horizontally or vertically for a landscape mode or a portrait mode).

The screen mode is switched by touching the display portion 1002 or operating the operation buttons 1003 of the housing 1001. The screen modes can also be switched depending on the kind of images displayed on the display portion 1002. For example, when a signal for an image displayed on the display portion is data of moving images, the screen mode is switched to the display mode, whereas when the signal is text data, the screen mode is switched to the input mode.

Moreover, the following control may be performed: in the input mode, when input by touching the display portion 1002 is not performed within a specified period while a signal detected by the optical sensor in the display portion 1002 is detected, the screen mode is switched from the input mode to the display mode.

The display portion 1002 can also be functioned as an image sensor. For example, an image of a palm print, a fingerprint, or the like is taken by touching the display portion 1002 with the palm or the finger, whereby personal authentication can be performed. Furthermore, by providing a backlight or a sensing light source emitting a near-infrared light for the display portion, an image of a finger vein, a palm vein, or the like can also be taken.

Figure 22B:
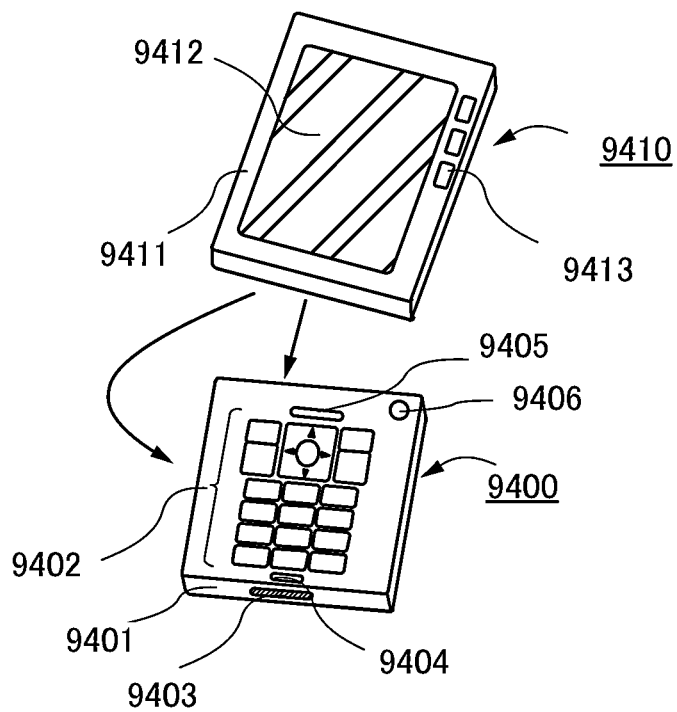

FIG. 22B also illustrates an example of a mobile phone. The mobile phone illustrated in FIG. 22B is provided with a display device 9410 having a display portion 9412 and operation buttons 9413 in a housing 9411 and a communication device 9400 having scan buttons 9402, an external input terminal 9403, a microphone 9404, a speaker 9405, and a light-emitting portion 9406 which emits light when receiving a call in a housing 9401. The display device 9410 equipped with a display function can be detached from or attached to the communication device 9400 equipped with a telephone function in two directions indicated by arrows. Therefore, the display device 9410 and the communication device 9400 can be attached to each other along either of respective short axes or long axes. In the case where only the display function is needed, the display device 9410 can be detached from the communication device 9400 and used alone. Images or input data can be transmitted or received by wireless or wire communication between the communication device 9400 and the display device 9410, each of which has a rechargeable battery.

This embodiment can be combined with the structure described in any other Embodiment, as appropriate.

This application is based on Japanese Patent Application serial no. 2009-008134 filed with Japan Patent Office on Jan. 16, 2009, the entire contents of which are hereby incorporated by reference.

What is claimed is:

1. A semiconductor device comprising:
a gate electrode over an insulating surface;
an insulating layer over the gate electrode;
a first oxide semiconductor layer over the insulating layer, the first oxide semiconductor layer containing indium and zinc;
a second oxide semiconductor layer over the first oxide semiconductor layer, the second oxide semiconductor layer containing indium, zinc, and silicon;
a channel protective layer over and in contact with the second oxide semiconductor layer; and
a source electrode and a drain electrode over the channel protective layer, the source electrode and the drain electrode being electrically connected to the second oxide semiconductor layer,
wherein a concentration of silicon in the second oxide semiconductor layer is larger than a concentration of silicon in the first oxide semiconductor layer, and
wherein crystallinity of the first oxide semiconductor layer is higher than crystallinity of the second oxide semiconductor layer.

2. The semiconductor device according to claim 1, wherein at least one of the first oxide semiconductor layer and the second oxide semiconductor layer contains gallium.

3. The semiconductor device according to claim 1, wherein at least one of the first oxide semiconductor layer and the second oxide semiconductor layer contains tin.

4. A mobile phone comprising the semiconductor device according to claim 1,
wherein the mobile phone comprises a display portion,
wherein the mobile phone is configured to operate by touching the display portion.

5. A semiconductor device comprising:
a gate electrode over an insulating surface;
an insulating layer over the gate electrode;
a first oxide semiconductor layer over the insulating layer, the first oxide semiconductor layer containing tin and zinc;
a second oxide semiconductor layer over the first oxide semiconductor layer, the second oxide semiconductor layer containing tin, zinc, and silicon;
a channel protective layer over and in contact with the second oxide semiconductor layer; and
a source electrode and a drain electrode over the channel protective layer, the source electrode and the drain electrode being electrically connected to the second oxide semiconductor layer,
wherein a concentration of silicon in the second oxide semiconductor layer is larger than a concentration of silicon in the first oxide semiconductor layer, and
wherein crystallinity of the first oxide semiconductor layer is higher than crystallinity of the second oxide semiconductor layer.

6. The semiconductor device according to claim 5, wherein at least one of the first oxide semiconductor layer and the second oxide semiconductor layer contains gallium.

7. The semiconductor device according to claim 5, wherein at least one of the first oxide semiconductor layer and the second oxide semiconductor layer contains tin.

8. A mobile phone comprising the semiconductor device according to claim 5,
wherein the mobile phone comprises a display portion,
wherein the mobile phone is configured to operate by touching the display portion.

9. A display device comprising:
an n-channel driving transistor comprising:
a gate electrode;
an insulating layer over the gate electrode;
a first oxide semiconductor layer over the insulating layer, the first oxide semiconductor layer containing zinc;
a second oxide semiconductor layer over the first oxide semiconductor layer, the second oxide semiconductor layer containing zinc and silicon;
a channel protective layer over and in contact with the second oxide semiconductor layer; and
a source electrode and a drain electrode over the channel protective layer, the source electrode and the drain electrode being electrically connected to the second oxide semiconductor layer;
a light-emitting element comprising:
a cathode;
a light-emitting layer over the cathode; and
an anode over the light-emitting layer,
wherein each of the first oxide semiconductor layer and the second oxide semiconductor layer contains at least one of indium and tin,
wherein a concentration of silicon in the second oxide semiconductor layer is larger than a concentration of silicon in the first oxide semiconductor layer,
wherein crystallinity of the first oxide semiconductor layer is higher than crystallinity of the second oxide semiconductor layer, and
wherein the cathode is electrically connected to one of the source electrode and the drain electrode.

10. The display device according to claim 9, wherein at least one of the first oxide semiconductor layer and the second oxide semiconductor layer contains gallium.

11. The display device according to claim 9, wherein at least one of the first oxide semiconductor layer and the second oxide semiconductor layer contains tin.

12. A mobile phone comprising the display device according to claim 9, wherein the mobile phone is configured to operate by touching a display portion including the display device.

\* \* \* \* \*